United States Patent
Patil et al.

(10) Patent No.: US 11,289,453 B2
(45) Date of Patent: Mar. 29, 2022

(54) PACKAGE COMPRISING A SUBSTRATE AND A HIGH-DENSITY INTERCONNECT STRUCTURE COUPLED TO THE SUBSTRATE

(71) Applicant: QUALCOMM Incorporated, San Diego, CA (US)

(72) Inventors: Aniket Patil, San Diego, CA (US); Zhijie Wang, San Diego, CA (US); Hong Bok We, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/803,804

(22) Filed: Feb. 27, 2020

(65) Prior Publication Data

US 2021/0272931 A1   Sep. 2, 2021

(51) Int. Cl.
*H01L 25/065* (2006.01)
*H01L 21/56* (2006.01)
*H01L 23/498* (2006.01)
*H01L 23/538* (2006.01)

(52) U.S. Cl.
CPC ......... *H01L 25/0657* (2013.01); *H01L 21/56* (2013.01); *H01L 23/49822* (2013.01); *H01L 23/49833* (2013.01); *H01L 23/49838* (2013.01); *H01L 23/5389* (2013.01); *H01L 25/0655* (2013.01); *H01L 2225/0652* (2013.01); *H01L 2225/06517* (2013.01)

(58) Field of Classification Search
CPC . H01L 25/0657; H01L 23/5389; H01L 21/56; H01L 23/49838; H01L 23/49822; H01L 25/0655; H01L 23/49833
See application file for complete search history.

(56) References Cited

U.S. PATENT DOCUMENTS

| | | | |
|---|---|---|---|
| 8,922,005 B2 * | 12/2014 | Hu | H01L 24/20 257/737 |
| 9,153,560 B2 | 10/2015 | Lane et al. | |
| 9,502,390 B2 * | 11/2016 | Caskey | H01L 25/0655 |
| 9,679,843 B2 * | 6/2017 | Starkston | H01L 25/0655 |
| 9,831,148 B2 * | 11/2017 | Yu | H01L 23/3128 |
| 10,181,456 B2 | 1/2019 | Kim, II | |
| 10,181,457 B2 * | 1/2019 | Prabhu | H01L 24/20 |
| 10,217,720 B2 * | 2/2019 | Wang | H01L 25/50 |

(Continued)

OTHER PUBLICATIONS

International Search Report and Written Opinion—PCT/US2021/019654—ISA/EPO—dated May 21, 2021.

*Primary Examiner* — Nicholas J Tobergte
(74) *Attorney, Agent, or Firm* — Qualcomm Incorporated

(57) ABSTRACT

A package comprising a substrate, an integrated device, and an interconnect structure. The substrate includes a first surface and a second surface. The substrate further includes a plurality of interconnects for providing at least one electrical connection to a board. The integrated device is coupled to the first surface of the substrate. The interconnect structure is coupled to the first surface of the substrate. The integrated device, the interconnect structure and the substrate are coupled together in such a way that when a first electrical signal travels between the integrated device and the board, the first electrical signal travels through at least the substrate, then through the interconnect structure and back through the substrate.

27 Claims, 20 Drawing Sheets

PROFILE VIEW

(56) References Cited

U.S. PATENT DOCUMENTS

| | | | |
|---|---|---|---|
| 10,366,951 B2* | 7/2019 | Starkston | H01L 23/5385 |
| 10,468,374 B2* | 11/2019 | Jain | H01L 24/17 |
| 10,483,156 B2* | 11/2019 | Leobandung | H01L 25/0655 |
| 10,546,834 B2* | 1/2020 | Wang | H01L 21/76877 |
| 10,630,296 B2* | 4/2020 | Lee | H03K 19/1776 |
| 10,804,204 B2* | 10/2020 | Rubin | H01L 21/50 |
| 10,854,551 B2* | 12/2020 | Yu | H01L 23/13 |
| 2007/0081312 A1 | 4/2007 | Noda et al. | |
| 2014/0252573 A1 | 9/2014 | Lin et al. | |
| 2014/0264791 A1* | 9/2014 | Manusharow | H01L 25/0655 |
| | | | 257/666 |
| 2016/0141234 A1 | 5/2016 | We et al. | |
| 2016/0379959 A1* | 12/2016 | We | H01L 25/105 |
| | | | 257/773 |
| 2018/0342476 A1 | 11/2018 | Wirz et al. | |
| 2019/0043792 A1 | 2/2019 | Weerasekera et al. | |
| 2019/0080974 A1 | 3/2019 | Ho et al. | |
| 2019/0304954 A1 | 10/2019 | England | |
| 2020/0243448 A1* | 7/2020 | Qian | H01L 24/24 |
| 2020/0286847 A1* | 9/2020 | Liu | H01L 25/50 |

\* cited by examiner

PROFILE VIEW

PROFILE VIEW

BOTTOM PLAN VIEW

BOTTOM PLAN VIEW

PROFILE VIEW

PROFILE VIEW

US 11,289,453 B2

PACKAGE COMPRISING A SUBSTRATE AND A HIGH-DENSITY INTERCONNECT STRUCTURE COUPLED TO THE SUBSTRATE

FIELD

Various features relate to packages that include an integrated device, but more specifically to a package that includes an integrated device, a substrate, and a high-density interconnect structure coupled to the substrate.

BACKGROUND

FIG. 1 illustrates a package 100 that includes a substrate 102, an integrated device 104, and an encapsulation layer 108. The substrate 102 includes a plurality of dielectric layers 120, a plurality of interconnects 122, and a plurality of solder interconnects 124. A plurality of solder interconnects 144 is coupled to the substrate 102 and the integrated device 104. The encapsulation layer 108 encapsulates the integrated device 104 and the plurality of solder interconnects 144. Fabricating a small package that includes a substrate with high density interconnects can be challenging. There is an ongoing need to provide more compact packages that can accommodate high density interconnects and/or high pin counts.

SUMMARY

Various features relate to packages that include an integrated device, but more specifically to a package that includes an integrated device, a substrate, and a high-density interconnect structure coupled to the substrate.

One example provides a package comprising a substrate, an integrated device, and an interconnect structure. The substrate includes a first surface and a second surface. The substrate further includes a plurality of interconnects. The integrated device is coupled to the substrate. The interconnect structure is coupled to a surface of the substrate. The integrated device, the interconnect structure and the substrate are coupled together in such a way that a first electrical signal of the integrated device is configured to travel through at least the substrate, then through the interconnect structure and back through the substrate.

Another example provides an apparatus that includes a substrate, an integrated device, and means for interconnect redistribution. The substrate includes a first surface and a second surface. The substrate further includes a plurality of interconnects. The integrated device is coupled to the substrate. The means for interconnect redistribution is coupled to a surface of the substrate. The integrated device, the means for interconnect redistribution and the substrate are coupled together in such a way that a first electrical signal of the integrated device is configured to travel through at least the substrate, then through the means for interconnect redistribution and back through the substrate.

Another example provides a method for fabricating a package. The method provides a substrate comprising a first surface and a second surface, where the substrate further comprises a plurality of interconnects. The method couples an integrated device to the substrate. The method couples an interconnect structure to a surface of the substrate. The integrated device, the interconnect structure, and the substrate are coupled together in such a way that a first electrical signal of the integrated device is configured to travel through at least the substrate, then through the interconnect structure and back through the substrate.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package that includes a substrate, an electronic circuit (which may be formed in an integrated device), and an interconnect structure. The substrate includes a first surface and a second surface. The substrate further includes a plurality of interconnects for providing electrical connections to a board. The integrated device is coupled to the first surface (or a second surface) of the substrate. The interconnect structure is coupled to the first surface (or a second surface) of the substrate. The integrated device, the interconnect structure and the substrate are coupled together in such a way that a first electrical signal of the integrated device is configured to travel through the substrate, then through the interconnect structure and back through the substrate. The interconnect structure may provide at least one electrical connection between two integrated devices coupled to the substrate. The interconnect structure may be a substrate that includes a dielectric layer and a plurality of redistribution interconnects. The interconnect structure may be a high-density interconnect structure that is configured to have interconnects with a lower minimum pitch than the minimum pitch of interconnects from the substrate. The interconnect structure may enable a package to have small and compact form factor, while also providing a high input/output (I/O) pin count.

Figure 1:
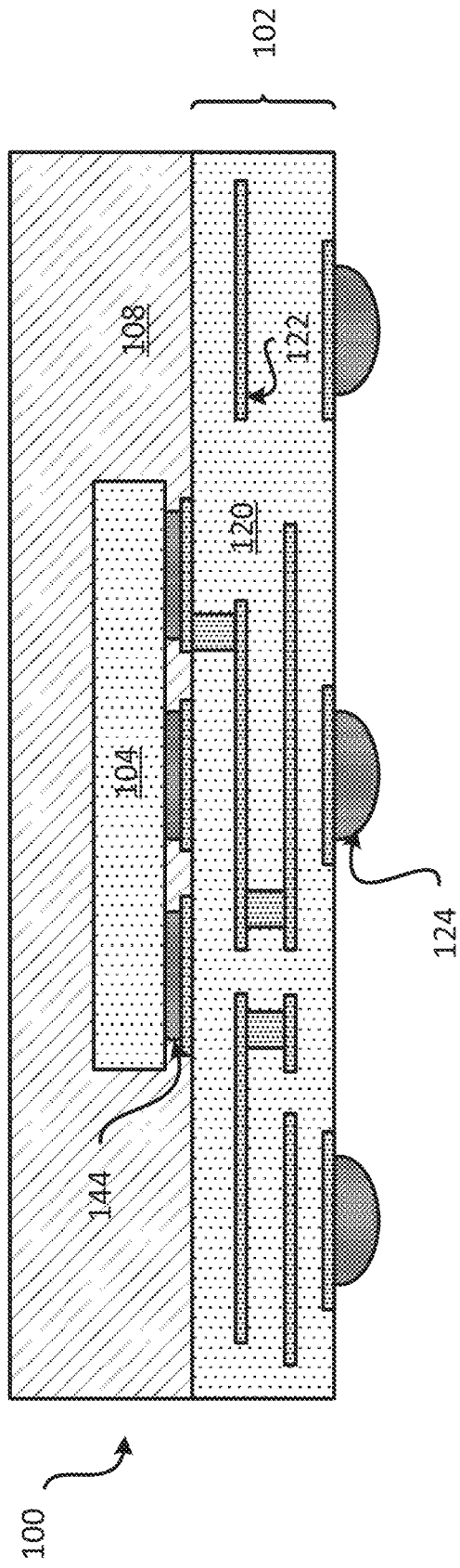
FIG. 1 illustrates a profile view of a package that includes an integrated device and a substrate.
Figure 2:
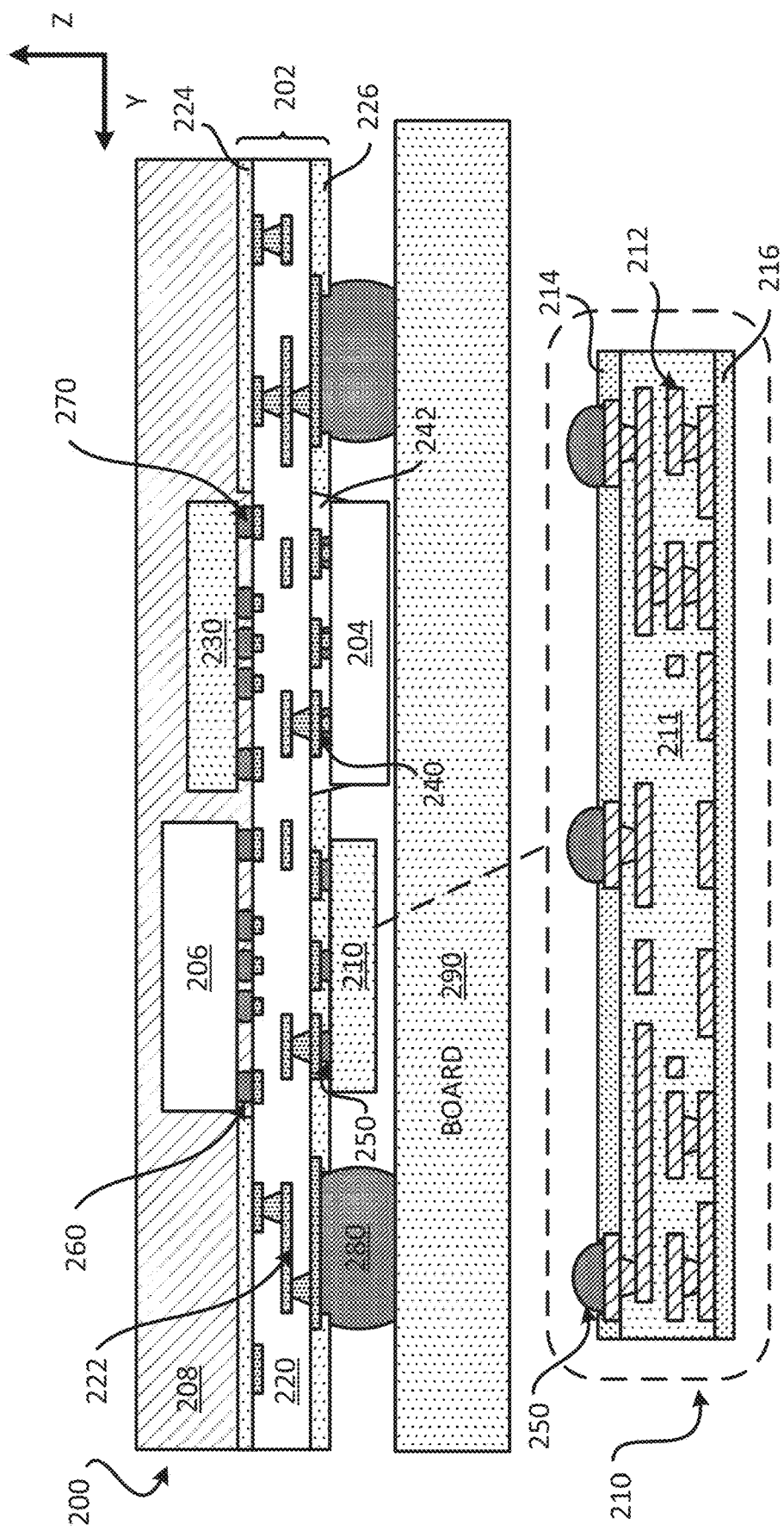
FIG. 2 illustrates a profile view of a package that includes a high-density interconnect structure coupled to a substrate.

Exemplary Package Comprising a High Density Interconnect Structure Coupled to a Substrate FIG. 2 illustrates a profile view of a package 200 that includes a high-density interconnect structure. The package 200 is coupled to a board 290 (e.g., printed circuit board (PCB)) through a plurality of solder interconnects 280. The package 200 provides a package with a compact small factor while also having a high input/output pin count.

As shown in FIG. 2, the package 200 includes a substrate 202, a first integrated device 204, a second integrated device 206, an encapsulation layer 208, a first interconnect structure 210, and a second interconnect structure 230. The substrate 202 may be considered the primary substrate (e.g., first substrate) of the package 200. As will be further described below, an integrated device (e.g., 204, 206), an interconnect structure (e.g., 210, 230), and the substrate 202 are coupled together in such a way that when an electrical signal (e.g., first electrical signal, second electrical signal) travels between the integrated device and a board (e.g., 290), the electrical signal travels through at least the substrate 202, then through the interconnect structure (e.g., 210, 230) and back through the substrate 202. This may be achieved by an interconnect structure (e.g., 210, 230) providing at least one electrical path between a first electrical contact provided by the substrate 202 and a second electrical contact provided by the substrate 202, where the first contact is electrically connected to the integrated device (e.g., 204, 206) and where the second contact is electrically connected to one or more of the interconnects.

The substrate 202 includes a first surface (e.g., bottom surface) and a second surface (e.g., top surface). The substrate 202 includes at least one dielectric layer 220, a plurality of interconnects 222, a first solder resist layer 224 and a second solder resist layer 226. The plurality of interconnects 222 may be configured to provide at least one electrical connection to and/or from a board (e.g., 290). The plurality of interconnects 222 may have a first minimum pitch and a first minimum line and spacing (L/S). In some implementations, the first minimum pitch for the plurality of interconnects 222 is in a range of approximately 100-200 micrometers (μm). In some implementations, the first minimum line and spacing (L/S) for the plurality of interconnects 222 is in a range of approximately 5/5-20/20 micrometers (μm). Different implementations may use different substrates. The substrate 202 may be a laminate substrate, a coreless substrate, a substrate that includes a core layer. In some implementations, the at least one dielectric layer 220 may include a core layer and/or prepreg layers. The at least one dielectric layer 220 may have a dielectric constant in a range of approximately 3.5-3.7. The at least one dielectric layer 220 may include glass fabrics for reinforcing the substrate 202. An example of fabricating a substrate is further described below in FIGS. 10A-10C. As will be further described below, in some implementations, the substrate 202 may be fabricated using a modified semi-additive process (mSAP) or a semi-additive process (SAP).

The first integrated device 204 is coupled to the first surface (e.g., bottom surface) of the substrate 202. The first integrated device 204 is coupled to the substrate through a plurality of interconnects 240. The plurality of interconnects 240 may include copper pillars and/or solder interconnects. An underfill 242 is located between the substrate 202 and the first integrated device 204. The underfill 242 may surround the plurality of interconnects 240. The first interconnect structure 210 is coupled to the first surface of the substrate 202. As will be further described below, the first interconnect structure 210 may be a high-density interconnect structure. The first interconnect structure 210 may be coupled to the substrate 202 through a plurality of solder interconnects 250 and/or pillar interconnects (e.g., copper pillar interconnects). When the package 200 is coupled to the board 290, the first integrated device 204 and the first interconnect structure 210 are located between the substrate 202 and the board 290. The first integrated device 204 and the first interconnect structure 210 may be located laterally to the plurality of solder interconnects 280. This configuration places the first integrated device 204 and the first interconnect structure 210 on the same side as the plurality of solder interconnects 280, which saves space and helps reduce the overall height and footprint of the package 200, by reducing the number of metal layers of the substrate 202 and/or reducing routing congestion in the substrate 202. The end result, is a package with a more compact form factor. In addition, the first interconnect structure 210 may help lower the cost of the substrate 202 (e.g., primary substrate) because the interconnects of the substrate 202 do not need to be as close together (e.g., lower L/S) to achieve near die break-out, since the interconnects of the first interconnect structure 210 will help with the near die break-out. As will be further described below, at least one interconnect structure may be located over another surface of the substrate 202. In some implementations, the interconnect structure may be integrated or embedded inside the substrate 202.

The second integrated device 206 is coupled to the second surface (e.g., top surface) of the substrate 202. The second integrated device 206 is coupled to the substrate through a plurality of interconnects 260. The plurality of interconnects 260 may include copper pillars and/or solder interconnects. The second interconnect structure 230 is coupled to the second surface of the substrate 202. The second interconnect structure 230 may be coupled to the substrate 202 through a plurality of solder interconnects 270.

The encapsulation layer 208 is located over the second surface (e.g., top surface) of the substrate 202 such that the encapsulation layer 208 encapsulates the second integrated device 206 and the second interconnect structure 230. The encapsulation layer 208 may include a mold, a resin, an epoxy and/or polymer. The encapsulation layer 208 may be a means for encapsulation.

The integrated device (e.g., 204, 206) may include a die (e.g., semiconductor bare die). The integrated device may include a radio frequency (RF) device, a passive device, a filter, a capacitor, an inductor, an antenna, a transmitter, a receiver, a GaAs based integrated device, a surface acoustic wave (SAW) filters, a bulk acoustic wave (BAW) filter, a light emitting diode (LED) integrated device, a silicon carbide (SiC) based integrated device, memory and/or combinations thereof. An integrated device (e.g., 204, 206) may include at least one electronic circuit (e.g., first electronic circuit, second electronic circuit, etc . . . ).

Different implementations may couple different components to the substrate 202. Other components (e.g., surface mounted components) that may be coupled to the substrate 202 include a passive device (e.g., capacitor). Examples of other components that may be coupled to the substrate 202 are illustrated and described below in FIG. 7.

The first interconnect structure 210 and the second interconnect structure 230 may be high-density interconnect structures that have a second minimum pitch and a second minimum line and spacing (L/S). In some implementations, the second minimum pitch for interconnects of the interconnect structure (e.g., 210, 230) is in a range of approximately 100-200 micrometers (μm). In some implementations, the second minimum line and spacing (L/S) for interconnects of the interconnect structure (e.g., 210, 230) is in a range of approximately 5/5-20/20 micrometers (μm) (e.g., minimum line width of approximately 5-20 micrometers (μm), minimum spacing of approximately 5-20 micrometers (μm)). The first interconnect structure 210 and the second interconnect structure 230 may each have interconnects with a respective second minimum pitch that is less than the first minimum pitch of the substrate 202. Similarly, the first interconnect structure 210 and the second interconnect structure 230 may each have interconnects with a respective minimum pitch that is less than the first minimum line and spacing (L/S) of the substrate 202. The interconnect structure (e.g., 210, 230) may be considered a secondary substrate (e.g., second substrate) that includes interconnects that have higher density than interconnects of the substrate 202 (e.g., primary substrate). The interconnect structure (e.g., 210, 230) is a localized device and/or structure configured to be placed in a region near an integrated device. The size of the interconnect structure may vary with different implementations. However, the footprint of the interconnect structure will be smaller than the footprint of the substrate 202. For example, in some implementations, the area occupied by an interconnect structure (e.g., 210, 230) may be 25% or less than the area of the substrate 202.

As will be further described below, some electrical signals (e.g., first electrical signal, second electrical signals) to and from integrated devices (e.g., 204, 206) may be configured to travel through the first interconnect structure 210 and/or the second interconnect structure 230. The interconnect structures, which have higher density interconnects, allow the package 200 to provide higher I/O pin counts, without having to increase the size of the package 200. For example, using the interconnect structure (e.g., 210, 230) may allow the substrate 202 to have a lower number of metal layers, which may help reduce the overall height of the package 200. The one or more interconnect structures (e.g., 210, 230) may help reduce congestion and/or entanglement in certain regions (e.g., regions near an integrated device) of the substrate 202 due to the high number of pin count and/or number of netlists.

FIG. 2 illustrates that the first interconnect structure 210 includes at least one dielectric layer 211, a plurality of interconnects 212, a solder resist layer 214 and a solder resist layer 216. The plurality of interconnects 212 may be redistribution interconnects. A redistribution interconnect may be an interconnect fabricated using a redistribution layer (RDL) fabrication processes. The first interconnect structure 210 may be configured as a substrate (e.g., a coreless substrate) that includes a plurality of redistribution layers (e.g., redistribution metal layers). As mentioned above, the interconnects of the interconnect structure may have higher density (e.g., lower minimum pitch and/or lower minimum L/S) than the interconnects of the substrate 202. The solder resist layer 214 is located over a first surface of the first interconnect structure 210. The solder resist layer 216 is located over a second surface of the first interconnect structure 210. The plurality of solder interconnects 250 is coupled to the first surface of the first interconnect structure 210.

The second interconnect structure 230 is similar to the first interconnect structure 210. The second interconnect structure 230 may include the same components and/or materials as the first interconnect structure 210. The second interconnect structure 230 may include a different number of metal layers (e.g., redistribution layers) than the first interconnect structure 210. An interconnect structure may be used to provide at least one electrical connection between two or more integrated devices. For example, an electrical signal between a first integrated device and a second integrated device may travel through a substrate (e.g., through first plurality of interconnects of substrate), through an interconnect structure (e.g., through plurality of interconnects of interconnect structure) and back through the substrate (e.g., through second plurality of interconnects of substrate). The first integrated device and the second integrated device may be located over the same surface of the substrate or over different surfaces of the substrate. The terms "first surface" and "second surface" of a substrate are arbitrary, and may means any surface of the substrate. For example, the first surface of the substrate may be a bottom surface of the substrate, and the second surface of the substrate may be a top surface of the substrate. In another example, the first surface of the substrate may be a top surface of the substrate, and the second surface of the substrate may be a bottom surface of the substrate. An interconnect structure (e.g., 210, 230) may be a means for interconnect redistribution. An example of a method for fabricating an interconnect structure is illustrated and described below in FIGS. 8A-8D.

As mentioned above, an interconnect structure is a component that is coupled to the substrate 202, so that the package 200 may provide higher I/O pin counts without having to increase the overall size of the package 200. In some implementations, one or more electrical signals to and from one or more integrated devices may travel through one or more interconnect structures. The one or more interconnect structures (e.g., 210, 230) may help reduce congestion and/or entanglement in certain areas of the substrate due to the high number of pin count and/or number of netlists. A netlist is an arrangement of components of a circuit and how the components are electrically coupled together.

In some implementations, the at least one dielectric layer 211 may include a prepreg layers and/or photo-imageable dielectric layers. The at least one dielectric layer 211 may have a dielectric constant in a range of approximately 3.3-4.0. In some implementations, the at least one dielectric layer 211 of the interconnect structure may include glass fabrics. However, the glass fabrics will be finer than the glass fabrics in the at least one dielectric layer 220 of the substrate 202.

Figure 3:
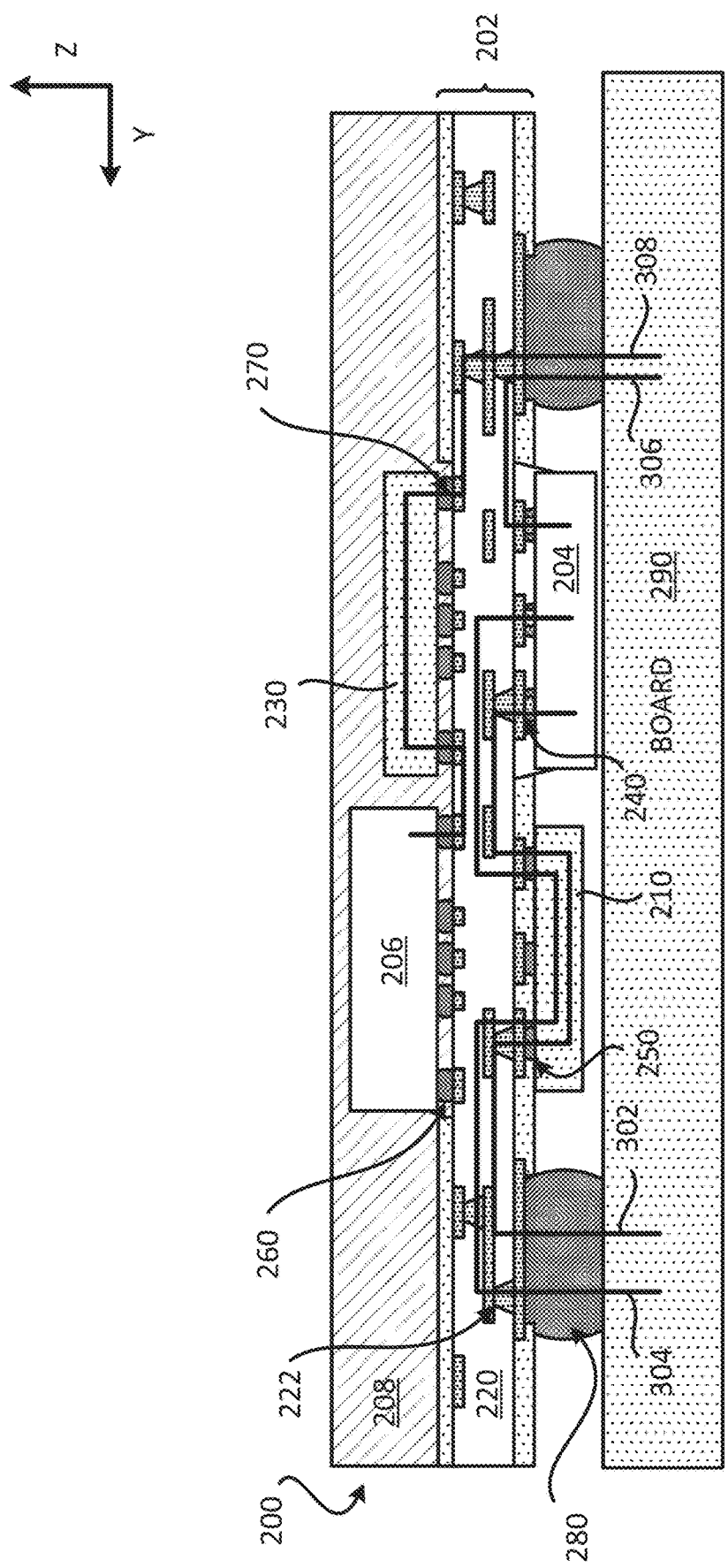
FIG. 3 illustrates a view of possible electrical paths in a package that includes a high-density interconnect structure coupled to a substrate.

FIG. 3 illustrates a view of how electrical signals may conceptually be configured to travel in a package. As shown in FIG. 3, a first electrical signal 302 may be configured to travel to and from the first integrated device 204. The path of the first electrical signal 302 (when starting from the first integrated device 204) includes travelling through (i) first interconnect(s) from the plurality of interconnects 240, (ii) first interconnect(s) from the plurality of interconnects 222 of the substrate 202, (iii) first solder interconnect(s) from the plurality of solder interconnects 250, (iv) first interconnect(s) (e.g., 212) from the first interconnect structure 210, (v) second solder interconnect(s) from the plurality of solder interconnects 250, (vi) second interconnects(s) from the plurality of interconnects 222 of the substrate 202, (vii) first solder interconnect from the plurality of solder interconnects 280, and (viii) interconnect of the board 290. In some implementations, the first electrical signal 302 may be configured to travel from the board 290 to the first integrated device 204, in the opposite sequence as described above. Thus, as described above, the first integrated device 204, the first interconnect structure 210 and the substrate 202 may be coupled together such that a first electrical signal 302 between the first integrated device 204 and a board 290, may be configured to travel through the substrate 202, then through the first interconnect structure 210 and back through the substrate 202.

FIG. 3 illustrates a second electrical signal 304 that may be configured to travel to and from the first integrated device 204. The path of the second electrical signal 304 (when starting from the first integrated device 204) includes travelling through (i) second interconnect(s) from the plurality of interconnects 240, (ii) third interconnect(s) from the plurality of interconnects 222 of the substrate 202, (iii) third solder interconnect(s) from the plurality of solder interconnects 250, (iv) second interconnect(s) (e.g., 212) from the first interconnect structure 210, (v) fourth solder interconnect(s) from the plurality of solder interconnects 250, (vi) fourth interconnects(s) from the plurality of interconnects 222 of the substrate 202, (vii) second solder interconnect from the plurality of solder interconnects 280, and (viii) interconnect of the board 290. In some implementations, the second electrical signal 304 may be configured to travel from the board 290 to the first integrated device 204, in the opposite sequence as described above.

FIG. 3 illustrates a third electrical signal 306 that may be configured to travel to and from the first integrated device 204. The path of the third electrical signal 306 (when starting from the first integrated device 204) includes travelling through (i) third interconnect(s) from the plurality of interconnects 240, (ii) fifth interconnect(s) from the plurality of interconnects 222 of the substrate 202, (iii) third solder interconnect from the plurality of solder interconnects 280, and (iv) interconnect of the board 290. In some implementations, the third electrical signal 306 may be configured to travel from the board 290 to the first integrated device 204, in the opposite sequence as described above.

FIG. 3 illustrates a fourth electrical signal 308 that may be configured to travel to and from the second integrated device 206. The path of the fourth electrical signal 308 (when starting from the second integrated device 206) includes travelling through (i) first interconnect(s) from the plurality of interconnects 260, (ii) sixth interconnect(s) from the plurality of interconnects 222 of the substrate 202, (iii) first solder interconnect(s) from the plurality of solder interconnects 270, (iv) first interconnect(s) from the second interconnect structure 230, (v) second solder interconnect(s) from the plurality of solder interconnects 270, (vi) seventh interconnects(s) from the plurality of interconnects 222 of the substrate 202, (vii) fourth solder interconnect from the plurality of solder interconnects 280, and (viii) interconnect of the board 290. In some implementations, the fourth electrical signal 308 may be configured to travel from the board 290 to the second integrated device 206, in the opposite sequence as described above.

It is noted that plurality of solder interconnects 280 may be representative of pins for the package 200. As such, the electrical signals and/or electrical paths shown may represent electrical signal paths between an integrated device and a pin of the package, where a pin is represented by a solder interconnect from the plurality of solder interconnects 280. It is noted that the pin may be represented by other components, such as a pillar (e.g., copper pillar). Different implementations may have a different number of electrical signals that travel to and from different integrated devices. The path of these electrical signals may vary. An electrical signal may include I/O signals. Instead of I/O signals, the exemplary paths shown in the disclosure may be applicable to power and/or ground as well.

Figure 4:
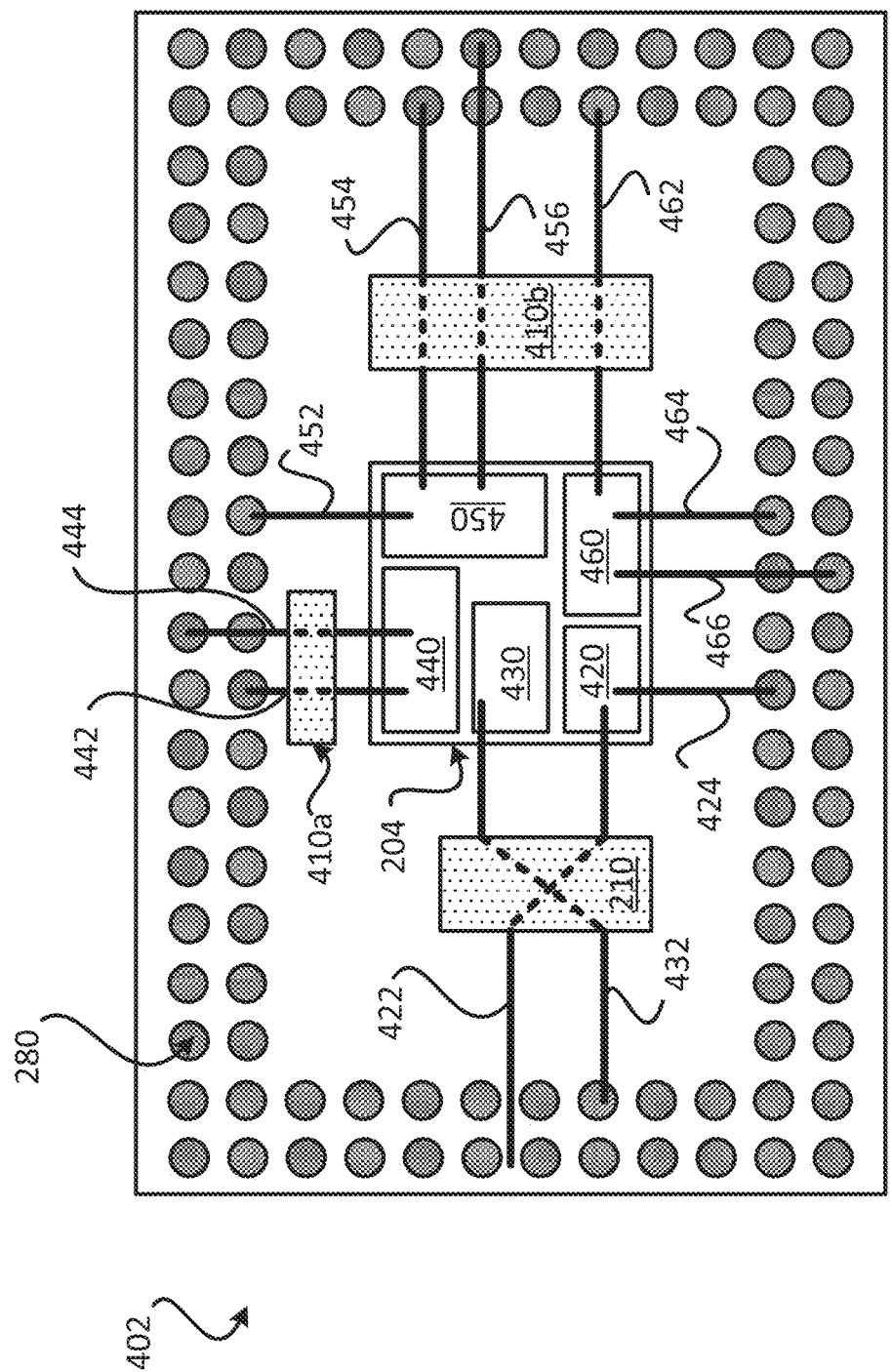
FIG. 4 illustrates a view of possible electrical paths in a package that includes a high-density interconnect structure coupled to a substrate.

FIG. 4 illustrates another view of how electrical signals may conceptually travel through a package. FIG. 4 illustrates a substrate 402, the first integrated device 204 coupled to the substrate 402, the first interconnect structure 210 coupled to the substrate 402, a second interconnect structure 410a coupled to the substrate 402, a third interconnect structure 410b coupled to the substrate 402 and a plurality of solder interconnects 280 coupled to the substrate 402. The plurality of solder interconnects 280 may represent pins for the substrate 402 and/or pins of a package that includes the substrate 402. The substrate 402 may be implemented in any of the packages described in the disclosure.

The first integrated device 204 may be configured to perform various functions, which are conceptually represented by the first function 420, the second function 430, the third function 440, the fourth function 450, and the fifth function 460. Different integrated devices may be configured to perform different functions and/or different number of functions. Examples of functions, include processing functions, computation functions, filter functions, transmission functions, receiving functions, compression functions, etc. In some implementations, each function may be associated with a specific netlist for the package.

As shown in FIG. 4, an electrical signal 422 to and from the first function 420 of the first integrated device 204 may travel through the substrate 402, the first interconnect structure 210, and back through the substrate 402 (in a similar manner as described in FIG. 3). Another electrical signal 424 to and from the first function 420 may travel through the substrate 402, bypassing an interconnect structure.

One advantage of a high-density interconnect structure, is the ability of the high-density interconnect structure to handle and deal with routing entanglement and/or routing congestion for the package. In some implementations, complicated, tight and/or difficult routing of interconnects may be done in the interconnect structure (e.g., 210). For example, routing entanglement and/or crossing of interconnects for different signals may be done in the interconnect structure (e.g., 210). FIG. 4 illustrates an electrical signal 432 to and from the second function 430 of the first integrated device 204 that may travel through the substrate 402, the first interconnect structure 210, and back through the substrate 402. The electrical signal 432 may travel through the first interconnect structure 210 such that the electrical signal 432 crosses (e.g., vertically crosses and/or horizontally crosses) with the electrical signal 422 that travel through interconnects in the first interconnect structure 210. It is noted that other electrical signals for the package may cross (e.g., vertically cross and/or horizontally cross) in an interconnect structure (e.g., 210, 230).

An electrical signal 442 to and from the third function 440 of the first integrated device 204 may travel through the substrate 402, the second interconnect structure 410a, and back through the substrate 402. Similarly, an electrical signal 444 to and from the third function 440 of the first integrated device 204 may travel through the substrate 402, the second interconnect structure 410a, and back through the substrate 402.

An electrical signal 452 to and from the fourth function 450 of the first integrated device 204 may travel through the substrate 402, bypassing an interconnect structure. An electrical signal 454 to and from the fourth function 450 of the first integrated device 204 may travel through the substrate 402, the third interconnect structure 410b, and back through the substrate 402. Similarly, an electrical signal 456 to and from the fourth function 450 of the first integrated device 204 may travel through the substrate 402, the third interconnect structure 410b, and back through the substrate 402.

An electrical signal 462 to and from the fifth function 460 of the first integrated device 204 may travel through the substrate 402, the third interconnect structure 410b, and back through the substrate 402. An electrical signal 464 to and from the fifth function 460 may travel through the substrate 402, bypassing an interconnect structure. An electrical signal 466 to and from the fifth function 460 may travel through the substrate 402, bypassing an interconnect structure.

Figure 5:
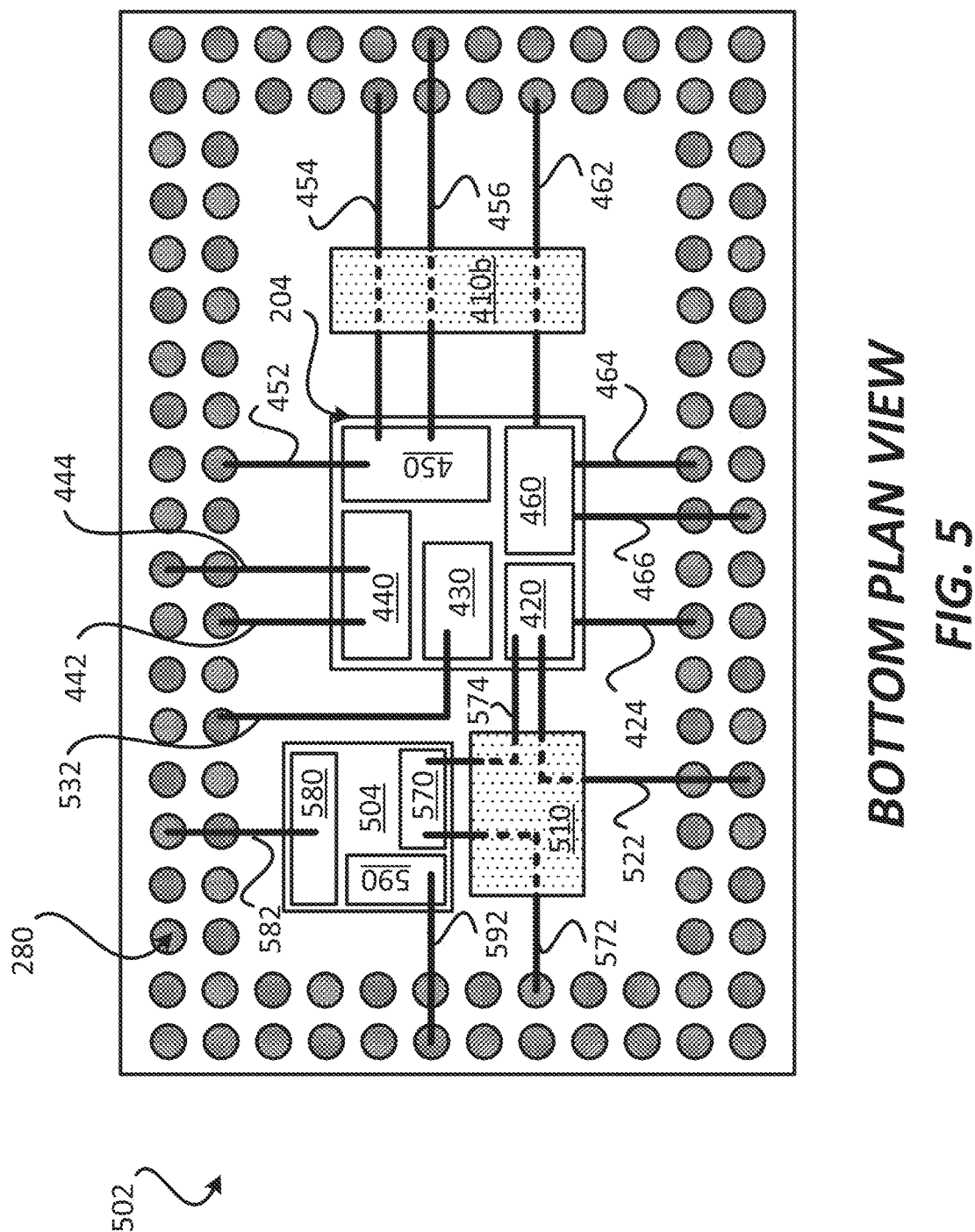
FIG. 5 illustrates a view of possible electrical paths in a package that includes a high-density interconnect structure coupled to a substrate.

FIG. 5 illustrates another view of how electrical signals may conceptually travel through a package. FIG. 5 illustrates a substrate 502, the first integrated device 204 coupled to the substrate 502, a second integrated device 504 coupled to the substrate 502, a first interconnect structure 510 coupled to the substrate 502, a third interconnect structure 410b coupled to the substrate 502 and a plurality of solder interconnects 280 coupled to the substrate 502.

The second integrated device 504 may be configured to perform various functions, which are conceptually represented by the first function 570, the second function 580, and the third function 590.

As shown in FIG. 5, an electrical signal 522 to and from the first function 420 of the first integrated device 204 may travel through the substrate 402, the first interconnect structure 510, and back through the substrate 502 (in a similar manner as described in FIG. 3). An electrical signal 532 to and from the second function 430 may travel through the substrate 502, bypassing an interconnect structure.

An electrical signal 572 to and from the first function 570 of the second integrated device 504 may be configured to travel through the substrate 402, the first interconnect structure 510, and back through the substrate 502 (in a similar manner as described in FIG. 3).

An electrical signal 574 between the first function 570 of the second integrated device 504 and the first function 420 of the first integrated device 204 may be configured to travel through the substrate 402, the first interconnect structure 510, and back through the substrate 502 (in a similar manner as described in FIG. 3).

An electrical signal 582 to and from the second function 580 of the second integrated device 504, may be configured to travel through the substrate 502, bypassing an interconnect structure. An electrical signal 592 to and from the third function 590 of the second integrated device 504, may be configured to travel through the substrate 502, bypassing an interconnect structure. It is noted that the electrical paths for various signals shown in FIGS. 3-5 are merely exemplary. Different implementations may provide different electrical paths for different functions of the integrated devices. In some implementations, one or more functions of an integrated device may be coupled to (i) electrical paths that go through an interconnect structure and/or (ii) electrical paths that bypass an interconnect structure.

Figure 6:
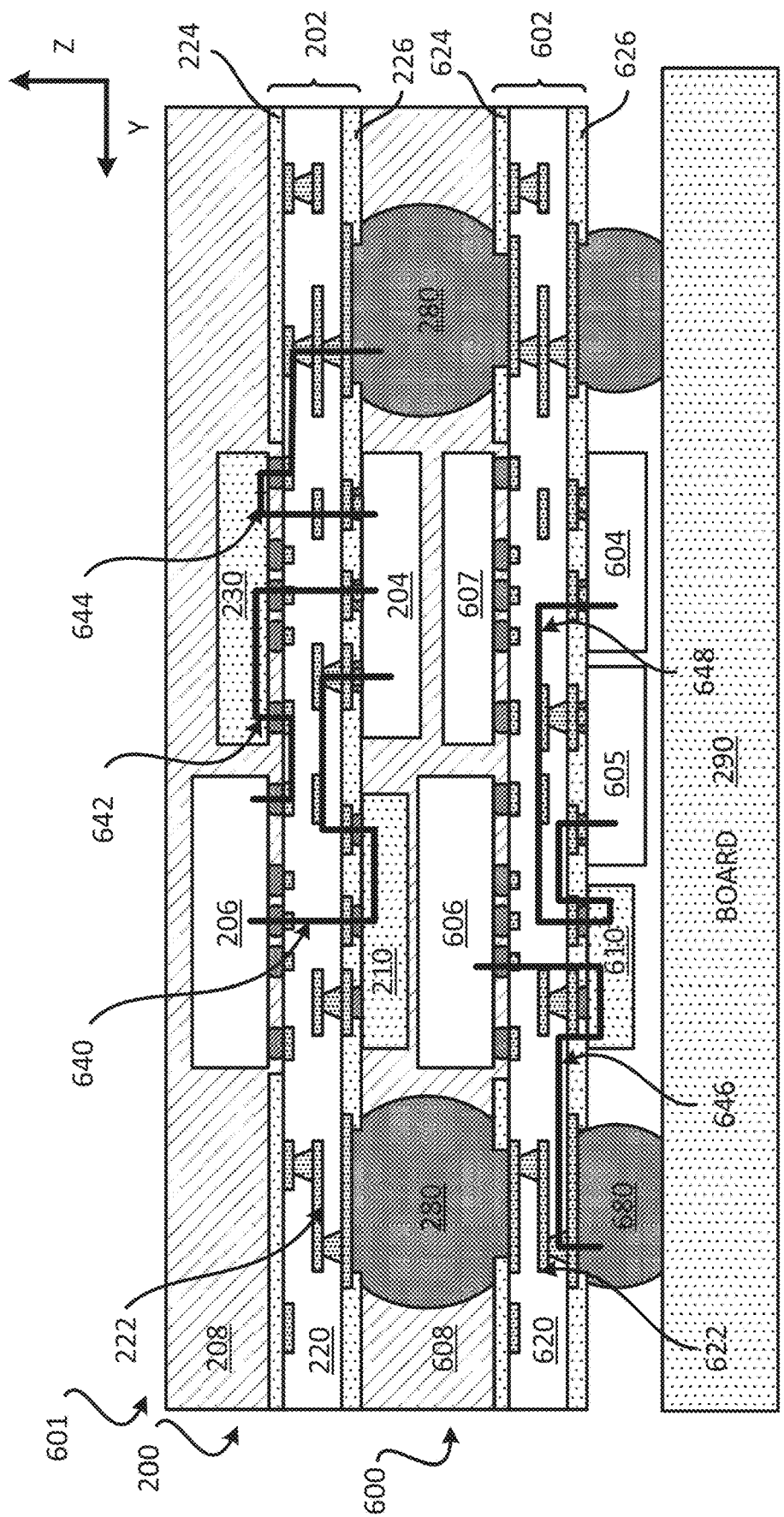
FIG. 6 illustrates a profile view of a package on package (PoP) that includes a high-density interconnect structure coupled to a substrate.

FIG. 6 illustrates a package on package (PoP) that includes a package with an interconnect structure. The PoP 601 includes the package 200 and a package 600. The package 600 may be a first package, and the package 200 may be a second package. The package 600 is coupled to the board 290 through the plurality of solder interconnects 680. The package 200 is coupled to the package 600 such that the package 200 is located over the package 600, and such that the package 600 is located between the board 290 and the package 200.

The package 600 is similar to the package 200, but may include different components than the package 200. The package 600 includes a substrate 602, a first integrated device 604, a second integrated device 606, the third integrated device 605, the fourth integrated device 607, an encapsulation layer 608, and a first interconnect structure 610. The substrate 602 includes at least one dielectric layer 620, a plurality of interconnects 622, a solder resist layer 624 and a solder resist layer 626.

FIG. 6 illustrates various exemplary and/or conceptual paths that at least one current (e.g., at least one electrical signal, at least one power) may take in the PoP 600. For example, an electrical signal 640 may travel between the first integrated device 204 and the second integrated device 206 through the first interconnect structure 210. The electrical signal 640 may be configured to travel through the substrate 202 (e.g., first plurality of interconnects of the substrate 202), through the first interconnect structure 210 (e.g., plurality of interconnects of the first interconnect structure 210), and back through the substrate 202 (e.g., second plurality of interconnects of the substrate 202).

In another example, an electrical signal 642 may be configured to travel between the first integrated device 204 and the second integrated device 206 through the second interconnect structure 230. The electrical signal 642 may be configured to travel through the substrate 202 (e.g., first plurality of interconnects of the substrate 202), through the second interconnect structure 230 (e.g., plurality of interconnects of the second interconnect structure 230), and back through the substrate 202 (e.g., second plurality of interconnects of the substrate 202).

In another example, an electrical signal 644 may be configured to travel between the first integrated device 204 and a solder interconnect 280 through the second interconnect structure 230. The electrical signal 644 may be configured to travel through the substrate 202 (e.g., first plurality of interconnects of the substrate 202), through the second interconnect structure 230 (e.g., plurality of interconnects of the second interconnect structure 230), and back through the substrate 202 (e.g., second plurality of interconnects of the substrate 202).

In another example, an electrical signal 646 may be configured to travel between the second integrated device 606 and a solder interconnect 680 through the first interconnect structure 610. The electrical signal 646 may be configured to travel through the substrate 602 (e.g., first plurality of interconnects of the substrate 602), through the first interconnect structure 610 (e.g., plurality of interconnects of the first interconnect structure 610), and back through the substrate 602 (e.g., second plurality of interconnects of the substrate 602).

In another example, an electrical signal 648 may be configured to travel between the first integrated device 604 and the second integrated device 606 through the first interconnect structure 610. The electrical signal 648 may be configured to travel through the substrate 602 (e.g., first plurality of interconnects of the substrate 602), through the first interconnect structure 610 (e.g., plurality of interconnects of the first interconnect structure 610), and back through the substrate 602 (e.g., second plurality of interconnects of the substrate 602).

The paths taken by the various electrical signals may be similar to the electrical paths described in FIG. 3. However, it is noted that the paths of the electrical signals shown in the disclosure are exemplary and/or conceptual. Different implementations may use different paths for the electrical signals. Moreover, electrical signals and/or electrical paths may travel through different types of interconnects (e.g., vias, traces, pads, pillars), solder interconnects and/or components (e.g., passive devices). Thus, for example, an electrical signal traveling between an integrated device and an interconnect structure may travel through at least one intervening component (e.g., passive device, capacitor) between the integrated device and the interconnect structure. The paths shown for the electrical signals may also be applied to power and/or ground.

Figure 7:
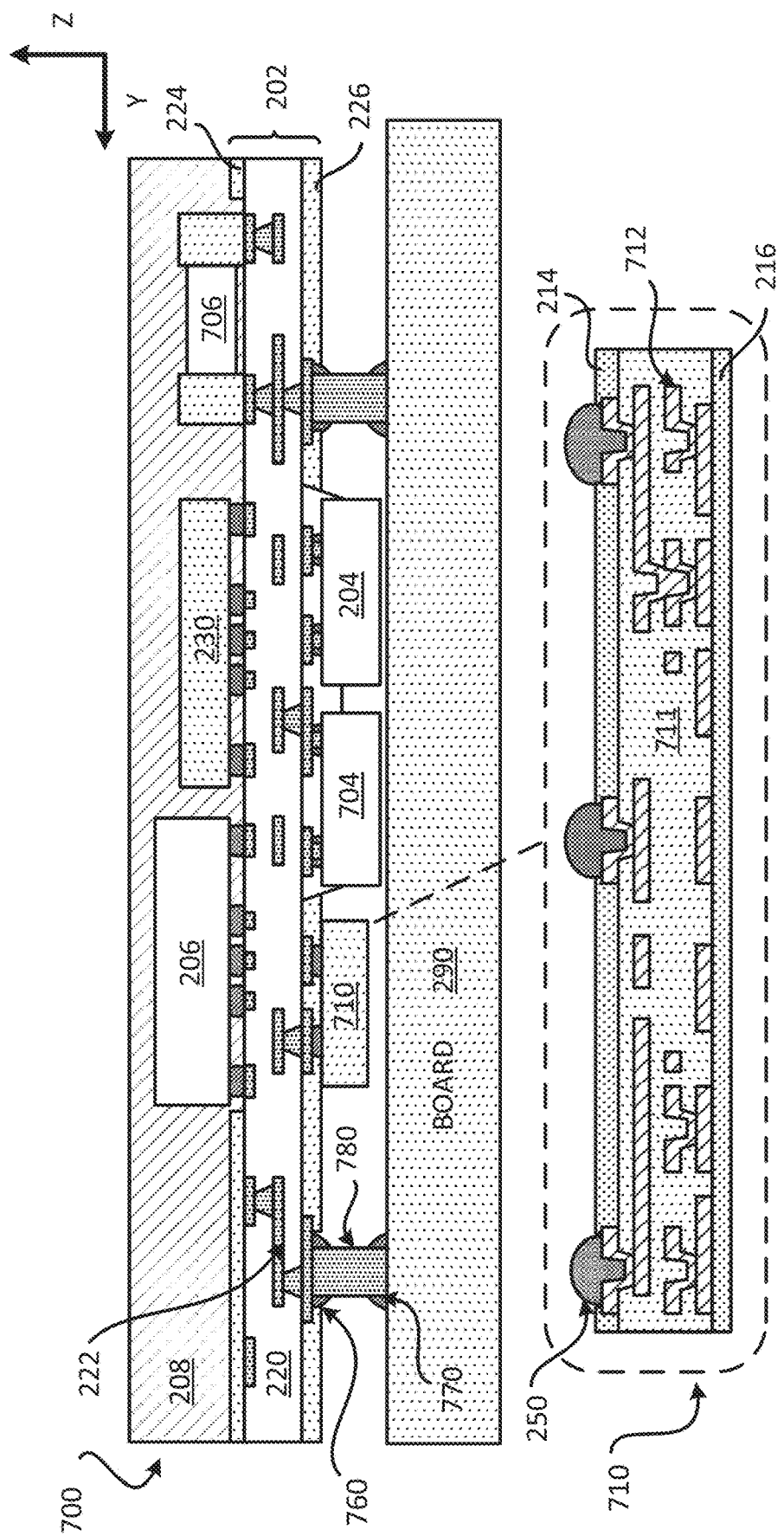
FIG. 7 illustrates a profile view of a package that includes a high-density interconnect structure coupled to a substrate.

As mentioned above, a package may include different components and/or different numbers of components that are located over different portions of the substrate. FIG. 7 illustrates a package 700 that includes an interconnect structure. The package 700 is similar to the package 200 of FIG. 2 and includes similar components to the package 200.

The package 700 includes the first integrated device 204, the second integrated device 206, the third integrated device 704, a first interconnect structure 710, the second interconnect structure 230, and a passive device 706.

The package 700 is coupled to the board 290 through a plurality of pillars (e.g., copper pillars) 780. A plurality of solder interconnects 760 may be used to couple the plurality of pillars 780 to the substrate 202. A plurality of solder interconnects 770 may be used to couple the plurality of pillars 780 to the board 290. The first integrated device 204, the third integrated device 704 and the first interconnect structure 710 are coupled to the first surface of the substrate 202. The first integrated device 204, the third integrated device 704 and the first interconnect structure 210 is located on the same side as the plurality of pillars 780.

The package 700 includes the first interconnect structure 710. The first interconnect structure 710 may be similar to the first interconnect structure 210. FIG. 7 illustrates that the first interconnect structure 710 includes at least one dielectric layer 711, a plurality of redistribution interconnects 712, the solder resist layer 214 and the solder resist layer 216. The plurality of redistribution interconnects 712 may be fabricated using redistribution layers processes (e.g., non-mSAP processes, non-SAP processes). As shown in FIG. 7, the plurality of redistribution interconnects 712 may have shapes that are different than the shapes of the interconnects 212. For example, at least some of the plurality of redistribution interconnects 712 may include a U-shape or V-shape. The terms "U-shape" and "V-shape" shall be interchangeable. The plurality of redistribution interconnects 712 may have similar minimum pitch and/or similar line and spacing (L/S) than the minimum pitch and/or L/S of the plurality of interconnects 212. Similarly, the at least one dielectric layer 711 may include similar materials as the at least one dielectric layer 211.

The first interconnect structure 710 and/or the plurality of pillars 780 may be implemented in any of the packages described in the disclosure. Having described various packages with interconnect structures, processes for fabricating an interconnect structure, a substrate, and a package.

Exemplary Sequence for Fabricating a High-Density Interconnect Structure

FIG. 8 (which includes FIGS. 8A-8D) illustrates an exemplary sequence for providing or fabricating a high-density interconnect structure. In some implementations, the sequence of FIGS. 8A-8D may be used to provide or fabricate the first interconnect structure 210 of FIG. 2, or any of the interconnect structure described in the disclosure.

It should be noted that the sequence of FIGS. 8A-8D may combine one or more stages in order to simplify and/or clarify the sequence for providing or fabricating the interconnect structure. In some implementations, the order of the processes may be changed or modified. In some implementations, one or more of processes may be replaced or substituted without departing from the spirit of the disclosure. Different implementations may fabricate an interconnect structure differently.

Figure 8A:
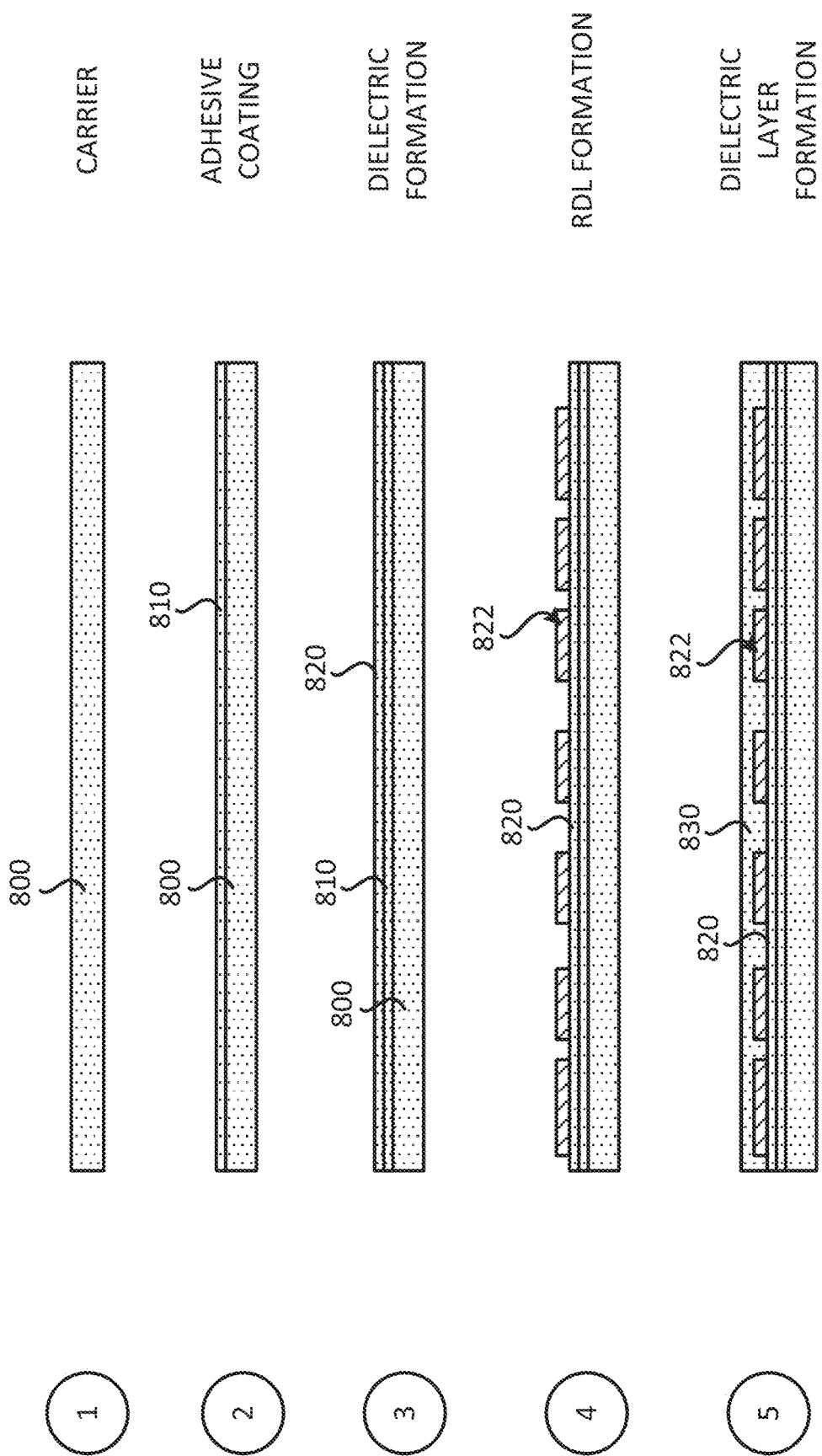
FIG. 8 (comprising FIGS. 8A-8D) illustrates an exemplary sequence for fabricating a high-density interconnect structure.

Stage 1, as shown in FIG. 8A, illustrates a state after a carrier 800 is provided. The carrier 800 may be a substrate and/or a wafer. The carrier 800 may include glass and/or silicon. The carrier 800 may be a first carrier.

Stage 2 illustrates a state after an adhesive layer 810 is disposed (e.g., formed) over the carrier 800. The adhesive layer 810 may be an adhesive film.

Stage 3 illustrates a state after a dielectric layer 820 is disposed over the adhesive layer 810. The dielectric layer 820 may include a polymer material. However, different implementations may include different materials. The dielectric layer 820 may be a passivation layer. The dielectric layer 820 may be deposited and/or coated over the adhesive layer 810. Different implementations may use different types of passivation layers. The passivation layer may include PSR, SR, PID and/or ABF.

Stage 4 illustrates a state after a plurality of interconnects 822 is formed over the dielectric layer 820. The plurality of interconnects 822 may include traces and/or pads. Forming the plurality of interconnects 822 may include forming a seed layer, performing a lithography process, a plating process, a stripping process and/or an etching process. Stage 4 may illustrate an example of forming a redistribution layer (e.g., redistribution metal layer) for a high-density interconnect structure. The plurality of interconnects 822 may be part of the plurality of interconnects 212.

Stage 5 illustrates a state after the dielectric layer 830 is formed over the plurality of interconnects 822 and the dielectric layer 820. The dielectric layer 830 may be deposited and/or coated over the plurality of interconnects 822 and the dielectric layer 820. The dielectric layer 830 may include polymer. The dielectric layer 830 may be similar to the dielectric layer 820.

Figure 8B:
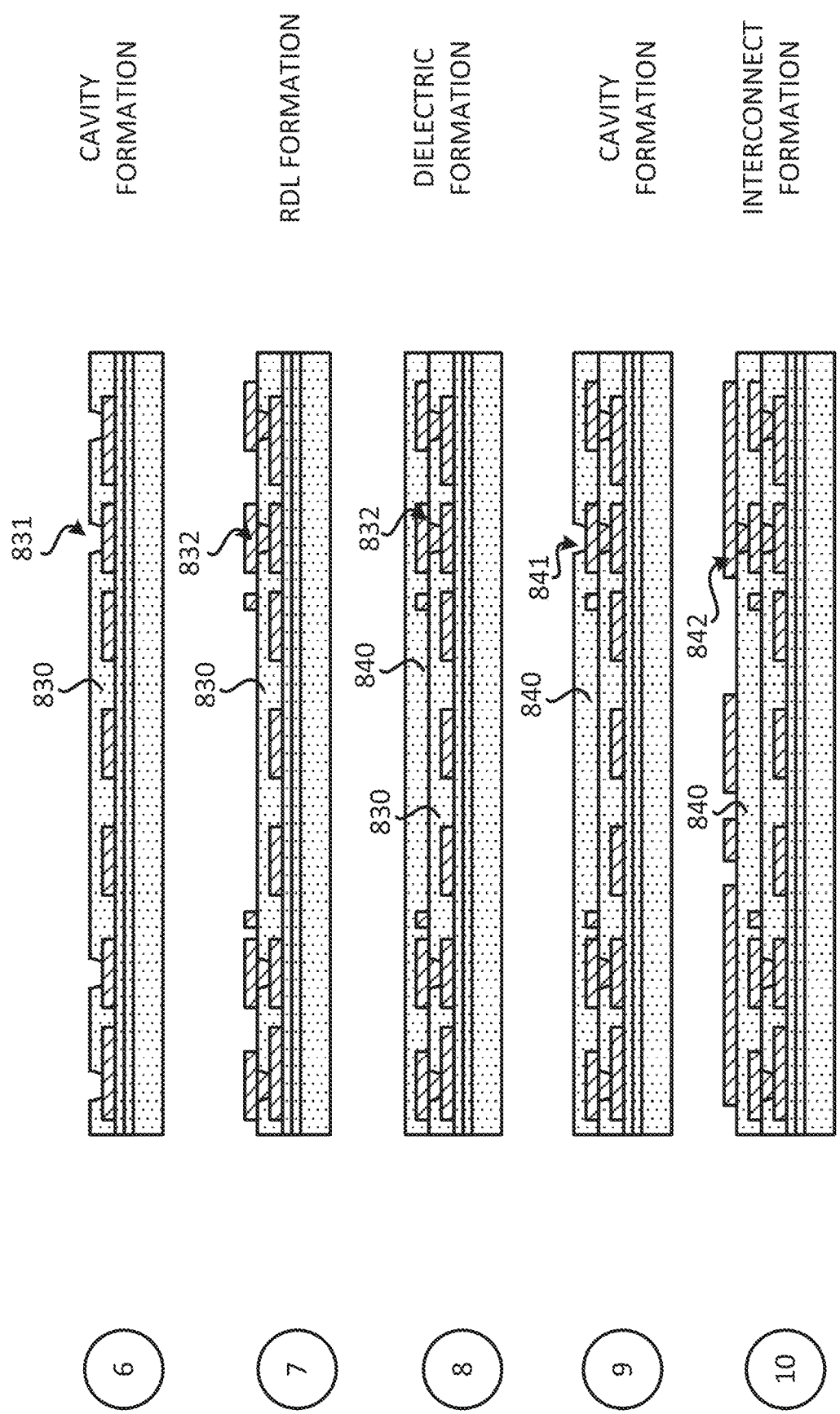

Stage 6, as shown in FIG. 8B, illustrates a state after cavities 831 are formed in the dielectric layer 830. An etching process may be used to form the cavities 831.

Stage 7 illustrates a state after a plurality of interconnects 832 is formed over the dielectric layer 830. The plurality of interconnects 832 may include vias, traces and/or pads. Forming the plurality of interconnects 832 may include forming a seed layer, performing a lithography process, a plating process, a stripping process and/or an etching process. Stage 7 may illustrate an example of forming a redistribution layer (e.g., redistribution metal layer) for a high-density interconnect structure. The plurality of interconnects 832 may be part of the plurality of interconnects 212.

Stage 8 illustrates a state after the dielectric layer 840 is formed over the plurality of interconnects 832 and the dielectric layer 830. The dielectric layer 840 may be deposited and/or coated over the plurality of interconnects 832 and the dielectric layer 830. The dielectric layer 840 may include polymer. The dielectric layer 840 may be similar to the dielectric layer 830.

Stage 9 illustrates a state after cavities 841 are formed in the dielectric layer 840. An etching process may be used to form the cavities 841.

Stage 10 illustrates a state after a plurality of interconnects 842 is formed over the dielectric layer 840. The plurality of interconnects 842 may include vias, traces and/or pads. Forming the plurality of interconnects 842 may include forming a seed layer, performing a lithography process, a plating process, a stripping process and/or an etching process. Stage 10 may illustrate an example of forming a redistribution layer (e.g., redistribution metal layer) for a high-density interconnect structure. The plurality of interconnects 842 may be part of the plurality of interconnects 212.

Figure 8C:
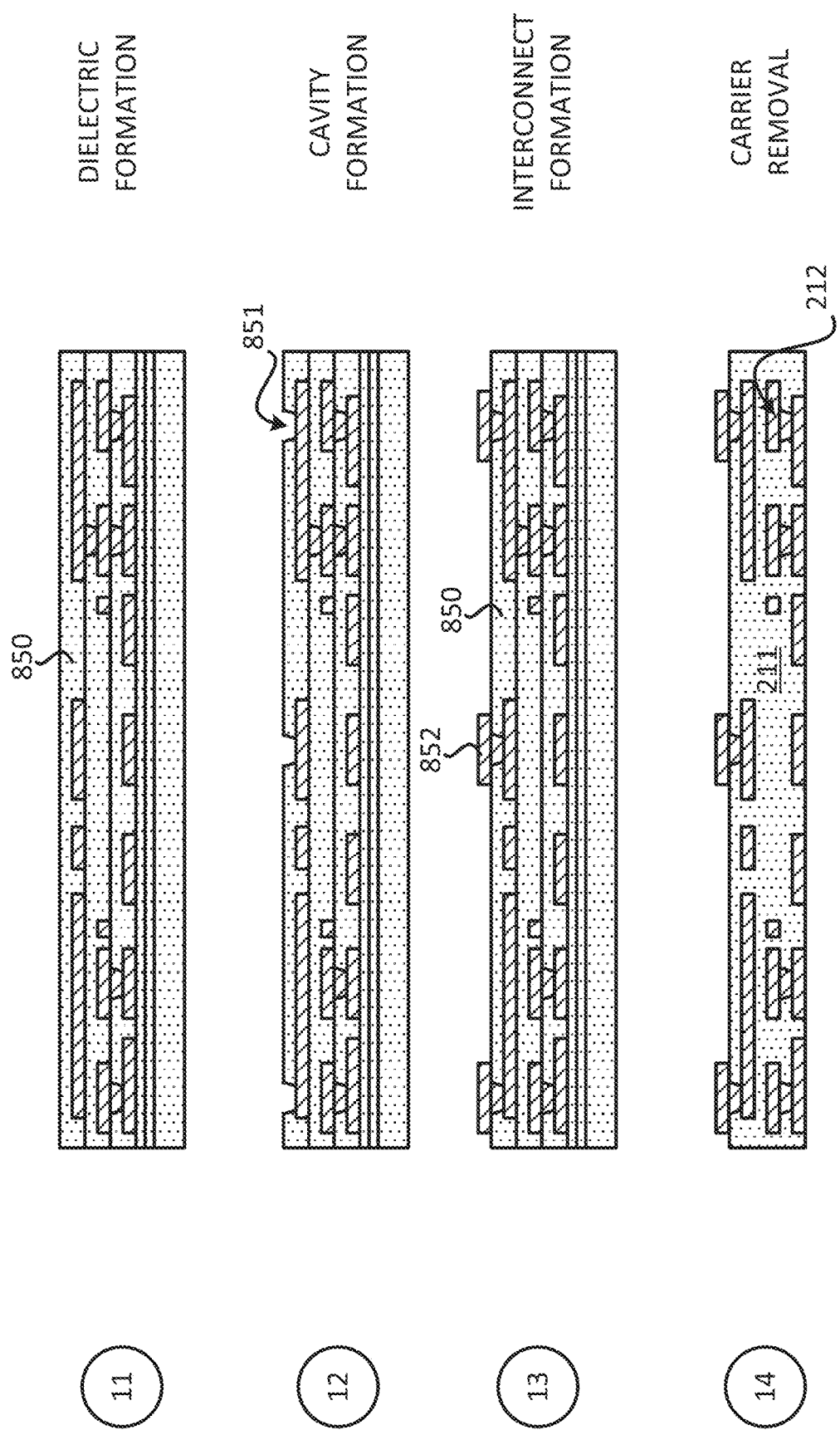

Stage 11, as shown in FIG. 8C, illustrates a state after the dielectric layer 850 is formed over the plurality of interconnects 842 and the dielectric layer 840. The dielectric layer 850 may be deposited and/or coated over the plurality of interconnects 842 and the dielectric layer 840. The dielectric layer 850 may include polymer. The dielectric layer 850 may be similar to the dielectric layer 840.

Stage 12 illustrates a state after cavities 851 are formed in the dielectric layer 850. An etching process may be used to form the cavities 851.

Stage 13 illustrates a state after a plurality of interconnects 852 is formed over the dielectric layer 850. The plurality of interconnects 852 may include vias, traces and/or pads. Forming the plurality of interconnects 852 may include forming a seed layer, performing a lithography process, a plating process, a stripping process and/or an etching process. Stage 13 may illustrate an example of forming a redistribution layer (e.g., redistribution metal layer) for a high-density interconnect structure. The plurality of interconnects 852 may be part of the plurality of interconnects 212.

Stage 14 illustrates a state after the carrier 800 and the adhesive 801 are decoupled (e.g., removed) from the dielectric layer 211. The dielectric layer 211 may represent the dielectric layer 820, the dielectric layer 830, the dielectric layer 840, and/or the dielectric layer 850. The plurality of interconnects 212 may represent the plurality of interconnects 822, 832, 842 and/or 852.

Figure 8D:
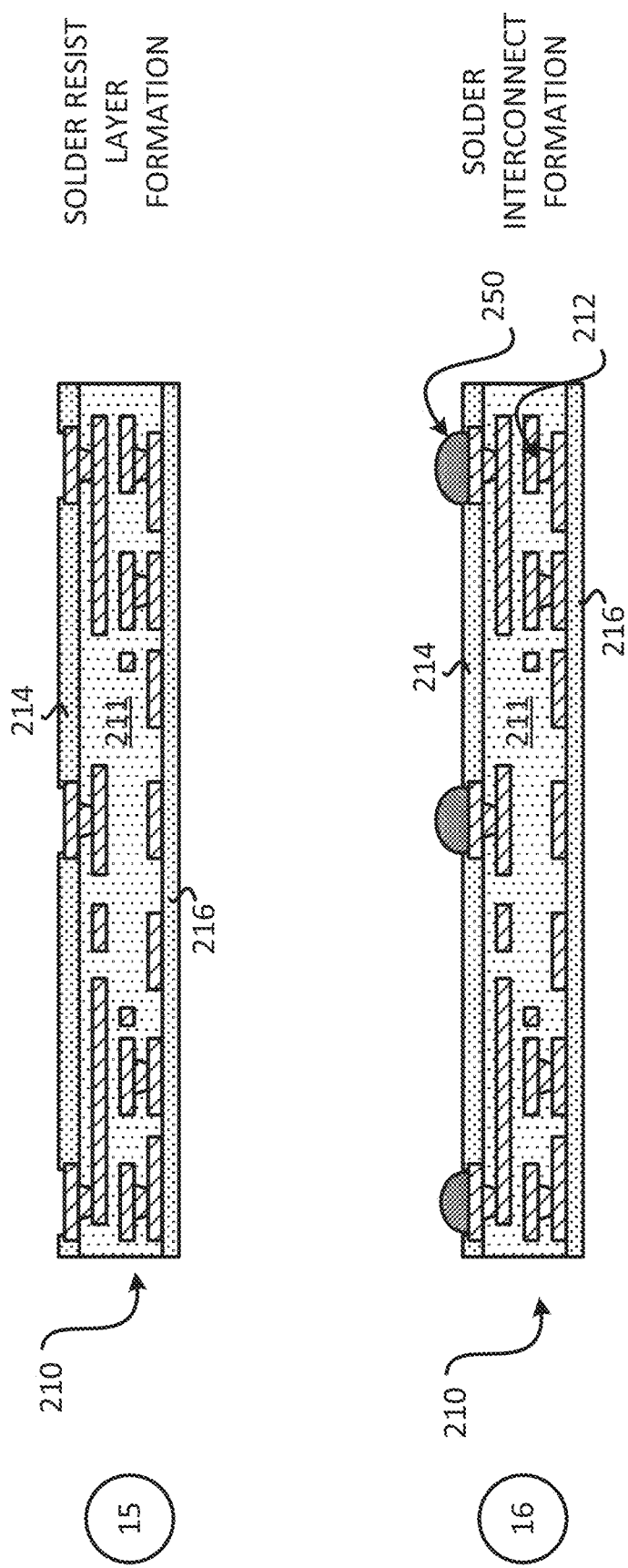

Stage 15, as shown in FIG. 8D, illustrates a state after the first solder resist layer 214 and the second solder resist layer 216 are formed over the first interconnect structure 210 (e.g., high density interconnect structure).

Stage 16 illustrates a state after the plurality of solder interconnects 250 is coupled to the first interconnect structure 210. Stages 15 and 16 may illustrate an example of the first interconnect structure 210 as described in FIG. 2. In some implementations, the first interconnect structure 210 is part of a wafer, and singulation may be performed to cut the wafer into individual interconnect structures. When a SAP process or a mSAP process is used to fabricate the interconnect structure (e.g., 210), the thickness of each of the dielectric layers (e.g., 820, 830, 840) may be approximately 20-25 micrometers (μm), and the thickness of each of the metal layers (on which interconnects are formed) may be approximately 15 micrometers (μm). In some implementations, the plurality of interconnects 212 may include redistribution interconnects that include a U-shape interconnect or a V-shape interconnect. In some implementations, the sequence of FIGS. 8A-8D may be used to fabricate the first interconnect structure 710 that includes the plurality of redistribution interconnects 712, where at least some of the redistribution interconnects include a U-shape interconnect or a V-shape interconnect. The terms "U-shape" and "V-shape" may refer to the side profile shape of the interconnects and/or redistribution interconnects. The U-shape interconnect and the V-shape interconnect may have a top portion and a bottom portion. A bottom portion of a U-shape interconnect (or a V-shape interconnect) may be coupled to a top portion of another U-shape interconnect (or a V-shape interconnect). When a redistribution layer (RDL) fabrication process is used to fabricate the interconnect structure (e.g., 710), the thickness of each of the dielectric layers (e.g., 820, 830, 840) may be approximately 5-10 micrometers (μm), and the thickness of each of the redistribution metal layers (on which redistribution interconnects are formed) may be approximately 5-10 micrometers (μm).

Figure 9:
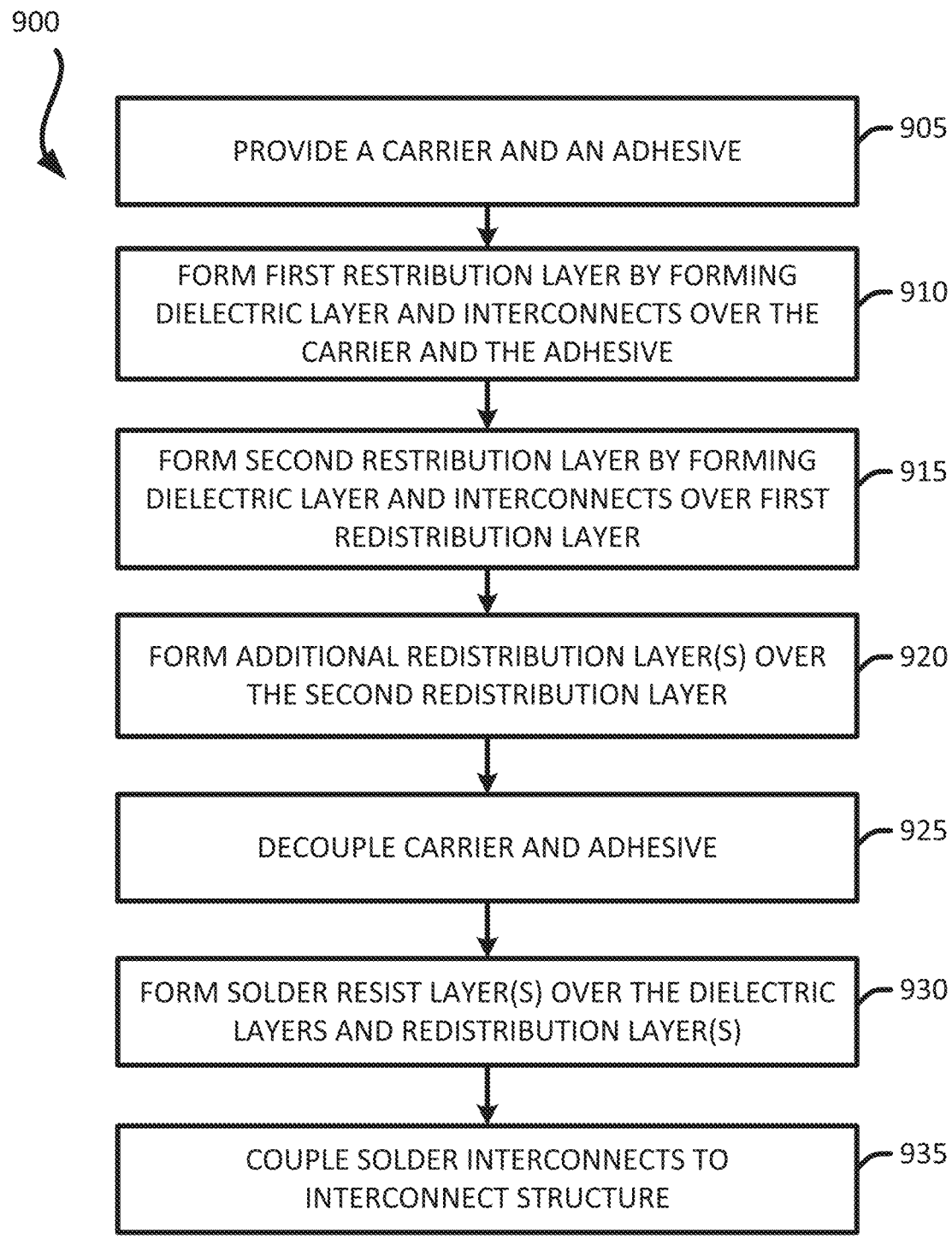
FIG. 9 illustrates an exemplary flow diagram of a method for fabricating a high-density interconnect structure.

Exemplary Flow Diagram of a Method for Fabricating a High-Density Interconnect Structure In some implementations, fabricating a package that includes a high density interconnect structure includes several processes. FIG. 9 illustrates an exemplary flow diagram of a method 900 for providing or fabricating a high-density interconnect structure. In some implementations, the method 900 of FIG. 9 may be used to provide or fabricate the high-density interconnect structure (e.g., 210, 230, 710) of FIGS. 2 and/or 7 described in the disclosure. However, the method 900 may be used to provide or fabricate any of the interconnect structures described in the disclosure.

It should be noted that the method of FIG. 9 may combine one or more processes in order to simplify and/or clarify the method for providing or fabricating an interconnect structure. In some implementations, the order of the processes may be changed or modified. FIG. 9 will be described in terms of fabricating redistribution interconnects. However, the method of FIG. 9 may be used to fabricate any type of interconnect.

The method provides (at 905) a carrier (e.g., 800). The carrier may include an adhesive layer 810 that is disposed over the carrier. The carrier 800 may be a substrate and/or a wafer. The carrier 800 may include glass and/or silicon. The adhesive layer 810 may be an adhesive film. Stages 1 and 2 of FIG. 8A illustrate an example of a carrier with and adhesive layer disposed over the carrier.

The method forms (at 910) a first redistribution layer by forming a dielectric layer (e.g., 820) and a plurality of interconnects 822 over the carrier and the adhesive. The dielectric layer may include a polymer. Forming the dielectric layer and the plurality of interconnects may include disposing (e.g., depositing, coating) a dielectric layer 820 over the adhesive layer 810, forming a seed layer, performing a lithography process, performing a plating process, performing a stripping process and/or performing an etching process. Stages 3-4 of FIG. 8A, illustrate an example of forming a first redistribution layer (e.g., redistribution metal layer) for a high-density interconnect structure.

The method forms (at 915) a second redistribution layer by forming a dielectric layer (e.g., 830) and a plurality of interconnects 832 over the first redistribution layer. The dielectric layer may include a polymer. Forming the dielectric layer and the plurality of interconnects may include disposing a dielectric layer 830 over the dielectric layer 820 and the interconnects 822, forming a seed layer, performing a lithography process, performing a plating process, performing a stripping process and/or performing an etching process. Stages 5-7 of FIGS. 8A-8B, illustrate an example of forming a second redistribution layer (e.g., redistribution metal layer) for a high-density interconnect structure.

The method forms (at 920) additional redistribution layer(s) by forming one or more dielectric layers (e.g., 840, 850) and a plurality of interconnects (e.g., 842, 852) over the second redistribution layer. The dielectric layer may include a polymer. Forming the dielectric layer and the plurality of interconnects may include disposing one or more dielectric layers (e.g., 840, 850) over the dielectric layer 830 and the interconnects 832, forming a seed layer, performing a lithography process, performing a plating process, performing a stripping process and/or performing an etching process. Stages 8-13 of FIGS. 8B-8C, illustrate an example of forming additional redistribution layers (e.g., redistribution metal layer) for a high-density interconnect structure.

The method decouples (at 925) the carrier (e.g., 800) and the adhesive (e.g., 810) from a dielectric layer (e.g., 820). Stage 14 of FIG. 8C illustrates an example of the carrier and the adhesive being decoupled from a dielectric layer.

The method forms (at 930) a first solder resist layer (e.g., 214) and a second solder resist layer (e.g., 216) over the dielectric layer of the interconnect structure (e.g., 210). Stage 15 of FIG. 8D, illustrates an example of solder resist layers formed over a dielectric layer of an interconnect structure.

The method couples (at 935) a plurality of solder interconnects (e.g., 250) is coupled to the interconnect structure (e.g., 210). Stage 16 of FIG. 8D may illustrate an example of solder interconnects coupled to an interconnect structure.

In some implementations, the first interconnect structure 210 is part of a wafer, and singulation may be performed to cut the wafer into individual interconnect structures. The method 900 may be used to fabricate an interconnect structure that includes the plurality of interconnects 212 and/or the plurality of redistribution interconnects 712.

Exemplary a Sequence for Fabricating a Substrate

Figure 10A:
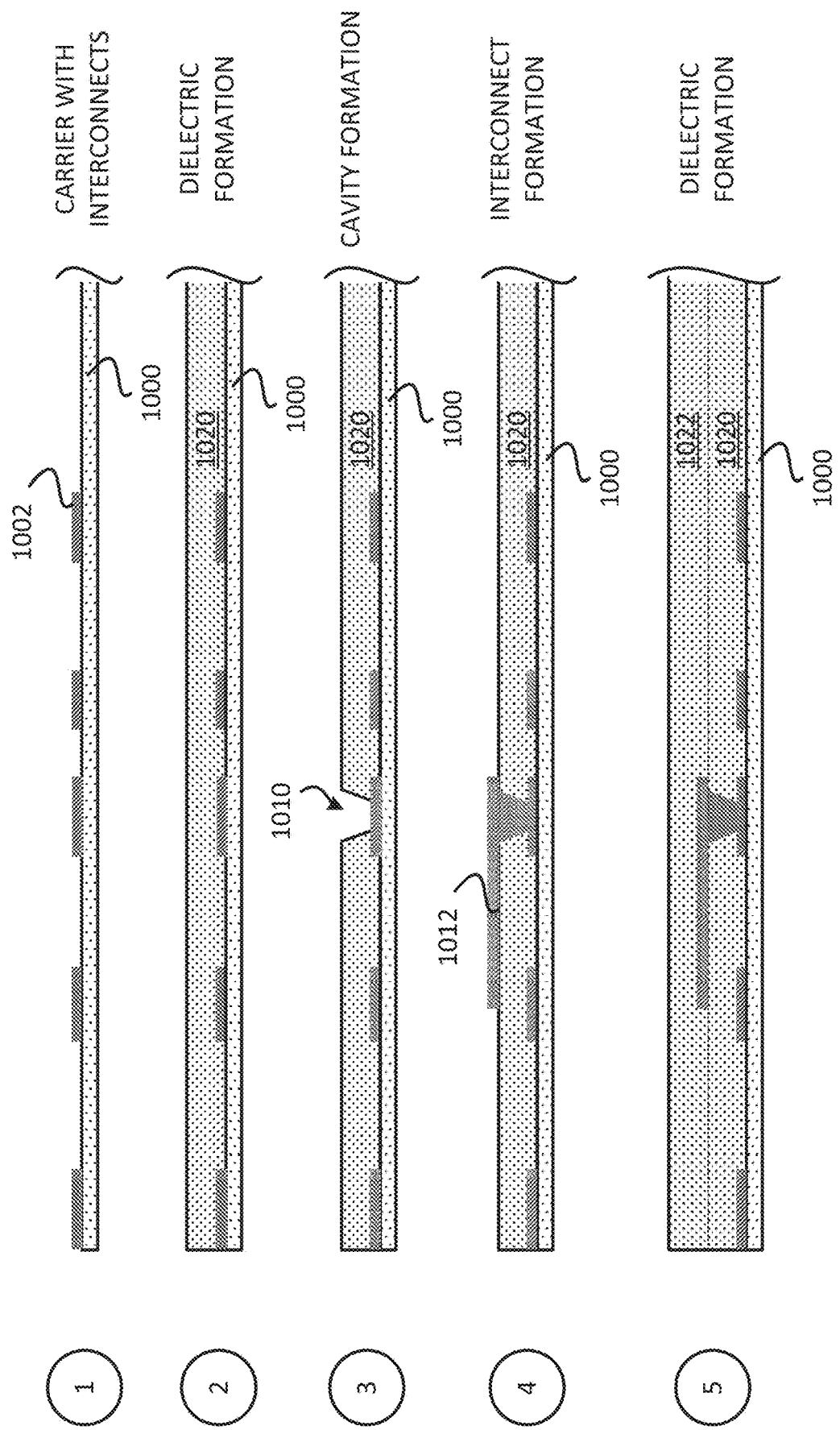
FIG. 10 (comprising FIGS. 10A-10C) illustrates an exemplary sequence for fabricating a substrate.
Figure 10B:
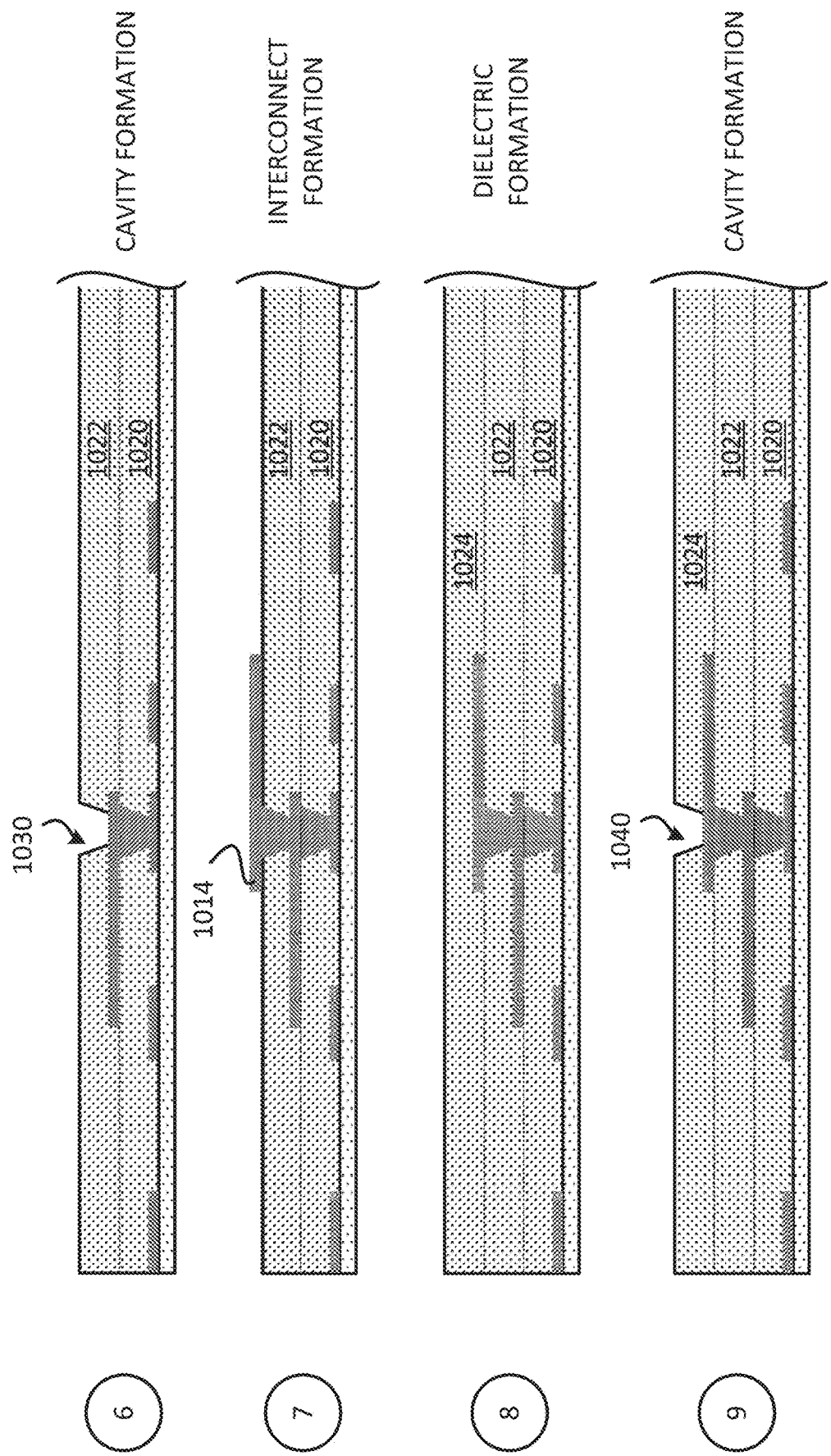
Figure 10C:
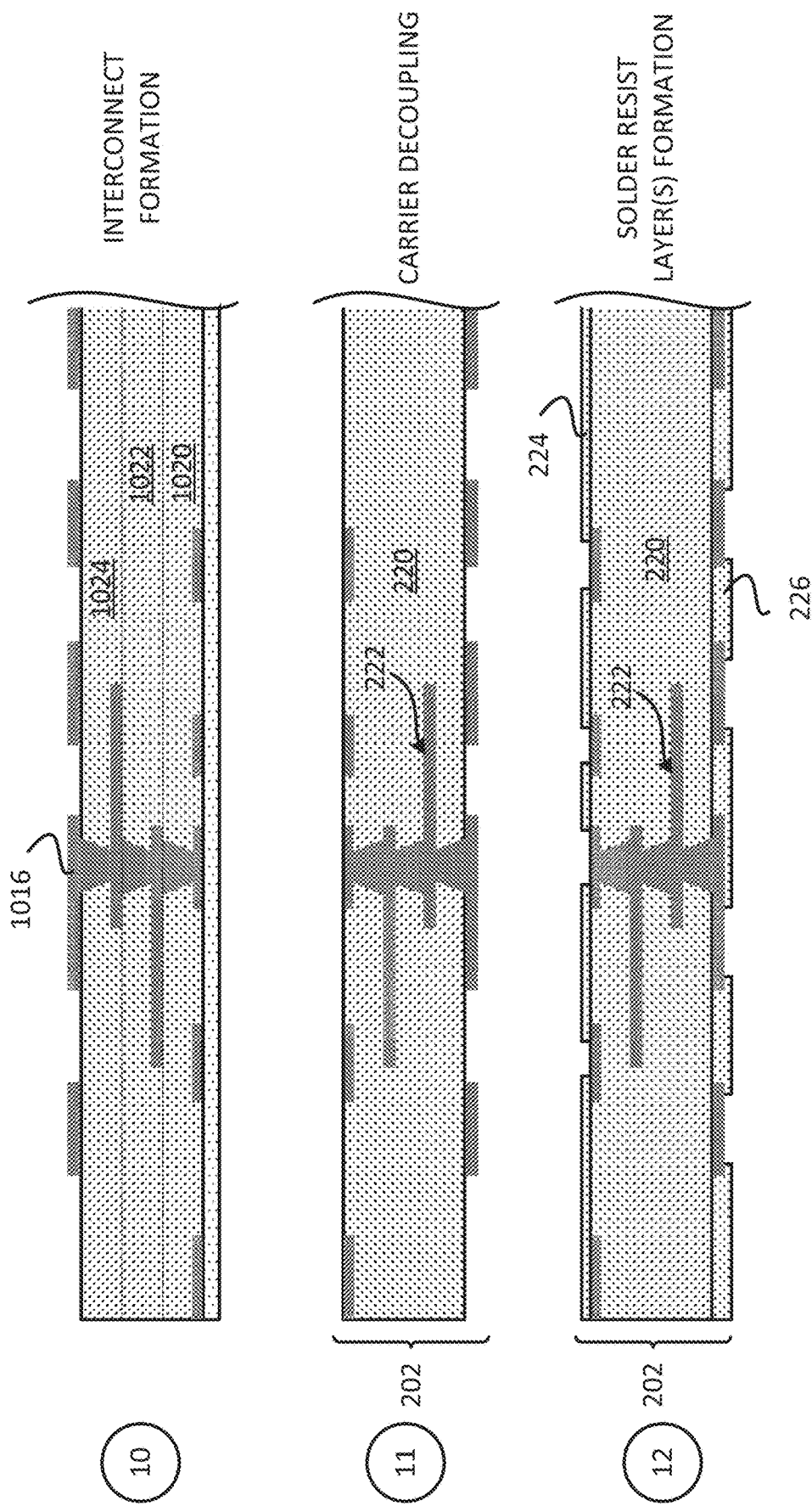

In some implementations, fabricating a substrate includes several processes. FIG. 10 (which includes FIGS. 10A-10C) illustrates an exemplary sequence for providing or fabricating a substrate. In some implementations, the sequence of FIGS. 10A-10C may be used to provide or fabricate the substrate 202 of FIG. 2. However, the process of FIG. 10 may be used to fabricate any of the substrates described in the disclosure.

It should be noted that the sequence of FIGS. 10A-10C may combine one or more stages in order to simplify and/or clarify the sequence for providing or fabricating a substrate. In some implementations, the order of the processes may be changed or modified. In some implementations, one or more of processes may be replaced or substituted without departing from the spirit of the disclosure.

Stage 1, as shown in FIG. 10A, illustrates a state after a carrier 1000 is provided and a metal layer is formed over the carrier 1000. The metal layer may be patterned to form interconnects 1002. A plating process and etching process may be used to form the metal layer and interconnects.

Stage 2 illustrates a state after a dielectric layer 1020 is formed over the carrier 1000 and the interconnects 1002. The dielectric layer 1020 may include polyimide. However, different implementations may use different materials for the dielectric layer.

Stage 3 illustrates a state after a plurality of cavities 1010 is formed in the dielectric layer 1020. The plurality of cavities 1010 may be formed using an etching process (e.g., photo etching process) or laser process.

Stage 4 illustrates a state after interconnects 1012 are formed in and over the dielectric layer 1020. For example, a via, pad and/or traces may be formed. A plating process may be used to form the interconnects.

Stage 5 illustrates a state after another dielectric layer 1022 is formed over the dielectric layer 1020. The dielectric layer 1022 may be the same material as the dielectric layer 1020. However, different implementations may use different materials for the dielectric layer.

Stage 6, as shown in FIG. 10B, illustrates a state after a plurality of cavities 1030 is formed in the dielectric layer 1022. An etching process or laser process may be used to form the cavities 1030.

Stage 7 illustrates a state after interconnects 1014 are formed in and over the dielectric layer 1022. For example, via, pad and/or trace may be formed. A plating process may be used to form the interconnects.

Stage 8 illustrates a state after another dielectric layer 1024 is formed over the dielectric layer 1022. The dielectric layer 1024 may be the same material as the dielectric layer 1020. However, different implementations may use different materials for the dielectric layer.

Stage 9 illustrates a state after a plurality of cavities 1040 is formed in the dielectric layer 1024. An etching process or laser process may be used to form the cavities 1040.

Stage 10, as shown in FIG. 10C, illustrates a state after interconnects 1016 are formed in and over the dielectric layer 1024. For example, via, pad and/or trace may be formed. A plating process may be used to form the interconnects.

Some or all of the interconnects 1002, 1012, 1014 and/or 1016 may define the plurality of interconnects 222 of the substrate 202. The dielectric layers 1020, 1022, 1024 may be represented by the at least one dielectric layer 220.

Stage 11 illustrates a state after the carrier 1000 is decoupled (e.g., removed, grinded out) from the dielectric layer 220, leaving the substrate 202.

Stage 12 illustrates a state after the first solder resist layer 224 and the second solder resist layer 226 are formed over the substrate 202.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Exemplary Flow Diagram of a Method for Fabricating a Substrate

Figure 11:
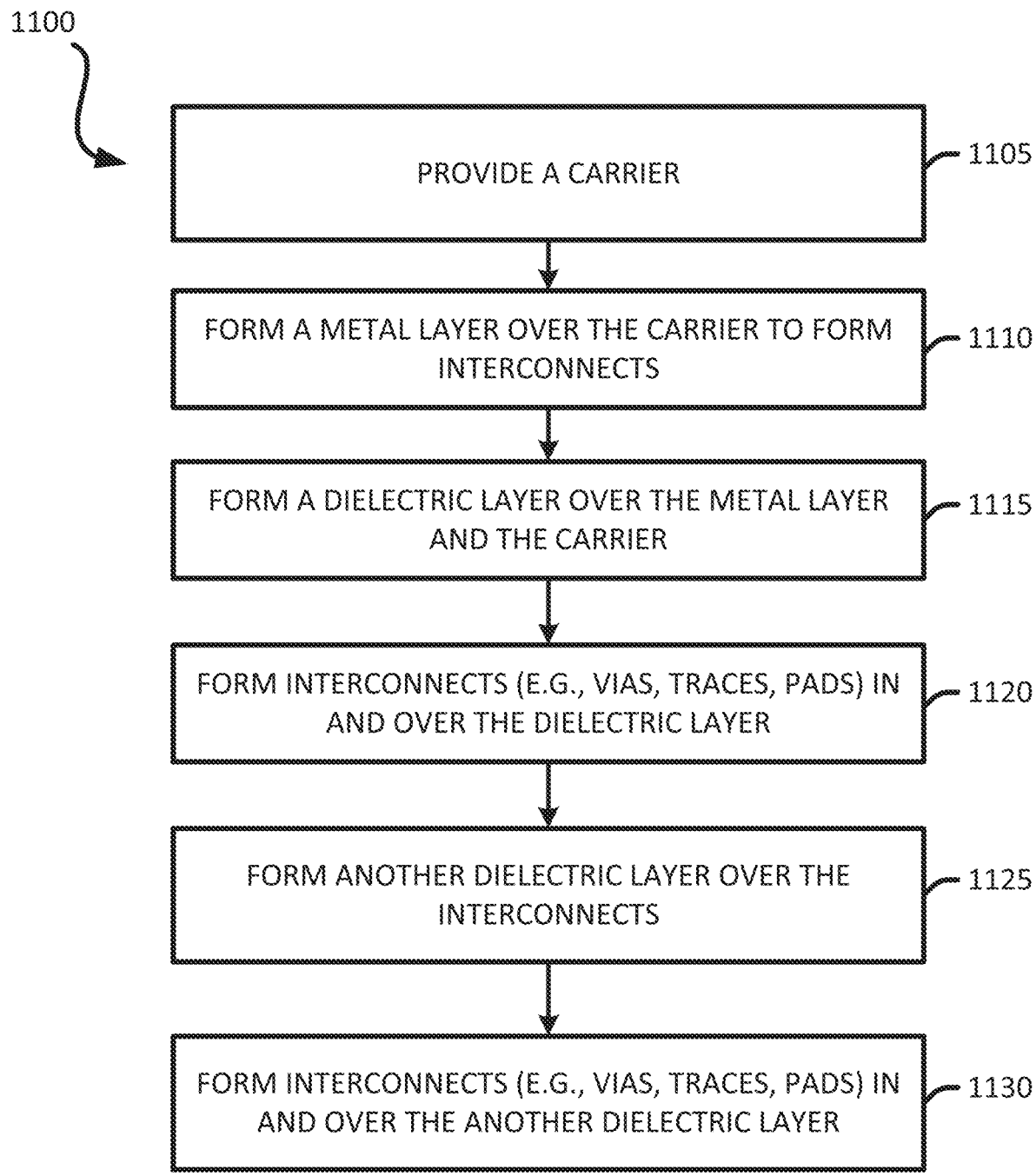
FIG. 11 illustrates an exemplary flow diagram of a method for fabricating a substrate.

In some implementations, fabricating a substrate includes several processes. FIG. 11 illustrates an exemplary flow diagram of a method 1100 for providing or fabricating a substrate. In some implementations, the method 1100 of FIG. 11 may be used to provide or fabricate the substrate of FIG. 2. For example, the method of FIG. 11 may be used to fabricate the substrate 202.

It should be noted that the method of FIG. 11 may combine one or more processes in order to simplify and/or clarify the method for providing or fabricating a substrate. In some implementations, the order of the processes may be changed or modified.

The method provides (at 1105) a carrier 1000. Different implementations may use different materials for the carrier. The carrier may include a substrate, glass, quartz and/or carrier tape. Stage 1 of FIG. 10A illustrates a state after a carrier is provided.

The method forms (at 1110) a metal layer over the carrier 1000. The metal layer may be patterned to form interconnects. A plating process may be used to form the metal layer and interconnects. Stage 1 of FIG. 10A illustrates a state after a metal layer and interconnects 1002 are formed.

The method forms (at 1115) a dielectric layer 1020 over the carrier 1000 and the interconnects 1002. The dielectric layer 1020 may include polyimide. Forming the dielectric layer may also include forming a plurality of cavities (e.g., 1010) in the dielectric layer 1020. The plurality of cavities may be formed using an etching process (e.g., photo etching) or laser process. Stages 2-3 of FIG. 10A illustrate forming a dielectric layer and cavities in the dielectric layer.

The method forms (at 1120) interconnects in and over the dielectric layer. For example, the interconnects 1012 may be formed in and over the dielectric layer 1020. A plating process may be used to form the interconnects. Forming interconnects may include providing a patterned metal layer over and/or in the dielectric layer. Stage 4 of FIG. 10A illustrates an example of forming interconnects in and over a dielectric layer.

The method forms (at 1125) a dielectric layer 1022 over the dielectric layer 1020 and the interconnects. The dielectric layer 1022 may include polyimide. Forming the dielectric layer may also include forming a plurality of cavities (e.g., 1030) in the dielectric layer 1022. The plurality of cavities may be formed using an etching process or laser process. Stages 5-6 of FIGS. 10A-10B illustrate forming a dielectric layer and cavities in the dielectric layer.

The method forms (at 1130) interconnects in and/or over the dielectric layer. For example, the interconnects 1014 may be formed. A plating process may be used to form the interconnects. Forming interconnects may include providing a patterned metal layer over an in the dielectric layer. Stage 7 of FIG. 10B illustrates an example of forming interconnects in and over a dielectric layer.

The method may form additional dielectric layer(s) and additional interconnects as described at 1125 and 1130. Stages 8-10 of FIG. 10B-10C illustrate an example of forming interconnects in and over a dielectric layer.

Once all the dielectric layer(s) and additional interconnects are formed, the method may decouple (e.g., remove, grind out) the carrier (e.g., 1000) from the dielectric layer 1020, leaving the substrate. In some implementations, the method may form solder resist layers (e.g., 224, 226) over the substrate.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Figure 12A:
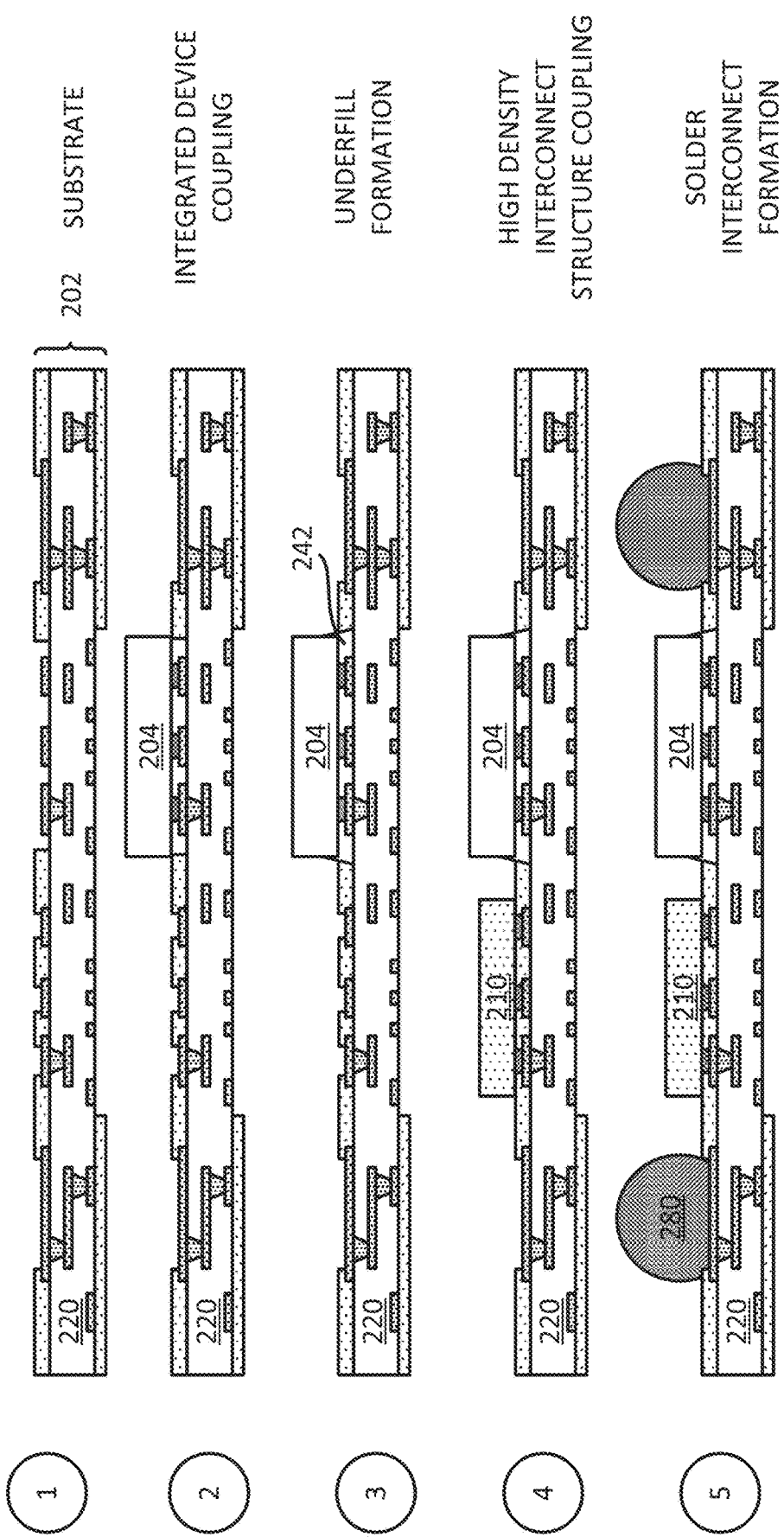
FIG. 12 (comprising FIGS. 12A-12B) illustrates an exemplary sequence for fabricating a package that includes a high-density interconnect structure coupled to a substrate.
Figure 12B:
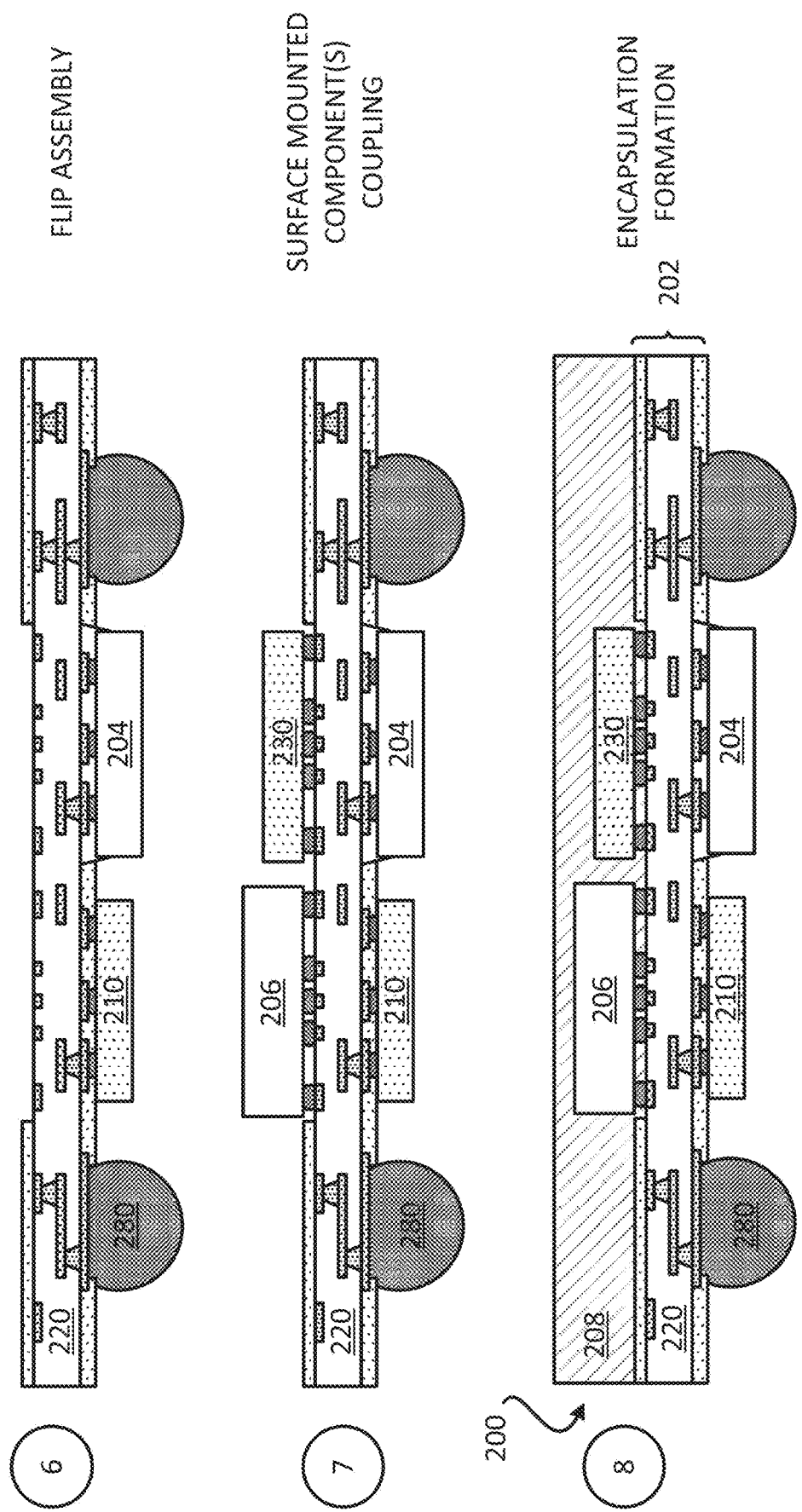

Exemplary Sequence for Fabricating a Package That Includes a High-Density Interconnect Structure Coupled to a Substrate FIG. 12 (which includes FIGS. 12A-12B) illustrates an exemplary sequence for providing or fabricating a package that includes a high-density interconnect structure coupled to a substrate. In some implementations, the sequence of FIGS. 12A-12B may be used to provide or fabricate the package 200 that includes the substrate 202 and the first interconnect structure 210 of FIG. 2, or any of the packages described in the disclosure.

It should be noted that the sequence of FIGS. 12A-12B may combine one or more stages in order to simplify and/or clarify the sequence for providing or fabricating the package. In some implementations, the order of the processes may be changed or modified. In some implementations, one or more of processes may be replaced or substituted without departing from the spirit of the disclosure. The sequence of FIGS. 12A-12B may be used to fabricate one package or several packages at a time (as part of a wafer).

Stage 1, as shown in FIG. 12A, illustrates a state after the substrate 202 is provided. The substrate 202 may be provided by a supplier or fabricated. A process similar to the process shown in FIGS. 10A-10C may be used to fabricate the substrate 202. However, different implementations may use different processes to fabricate the substrate 202. Examples of processes that may be used to fabricate the substrate 202 include a semi-additive process (SAP) and a modified semi-additive process (mSAP). The substrate 202 includes at least one dielectric layer 220, and a plurality of interconnects 222.

Stage 2 illustrates a state after the first integrated device 204 is coupled to a first surface (e.g., bottom surface) of the substrate 202. The first integrated device 204 is coupled to the substrate 202 through the plurality of interconnects 240. The plurality of interconnects 240 may be coupled to interconnects from the plurality of interconnects 222 of the substrate 202. The first integrated device 204 may be coupled to the substrate 202 such that the front side (e.g., active side) of the first integrated device 204 is facing the substrate 202.

Stage 3 illustrates a state after an underfill 242 is provided between the substrate 202 and the first integrated device 204.

Stage 4 illustrates a state after the first interconnect structure 210 is coupled to the first surface of the substrate 202. The first interconnect structure 210 may be coupled to the substrate 202 through a plurality of solder interconnects.

Stage 5 illustrates a state after the plurality of solder interconnects 280 is coupled to the first surface of the substrate 202. The plurality of solder interconnects 280 may be coupled to interconnects from the plurality of interconnects 222 of the substrate 202.

Stage 6, as shown in FIG. 12B, illustrates a state after the substrate 202 with the first integrated device 204, the first interconnect structure 210 and the plurality of solder interconnects 280, are flipped.

Stage 7 illustrates a state after several components are coupled to a second surface (e.g., top surface) of the substrate 202. For example, the second integrated device 206 and the second interconnect structure 230 are coupled to the second surface of the substrate 202.

Stage 8 illustrates a state after the encapsulation layer 208 is formed over the second surface of the substrate 202 such that the encapsulation layer 208 encapsulates the second integrated device 206 and the second interconnect structure 230. The process of forming and/or disposing the encapsulation layer 208 may include using a compression and transfer molding process, a sheet molding process, or a liquid molding process. Stage 8 may illustrate the package 200 that includes the substrate 202, the first integrated device 204, the first interconnect structure 210, the second integrated device 206, the second interconnect structure 230, and the encapsulation layer 208.

The packages (e.g., 200, 600, 700) described in the disclosure may be fabricated one at a time or may be fabricated together as part of one or more wafers and then singulated into individual packages.

Figure 13:
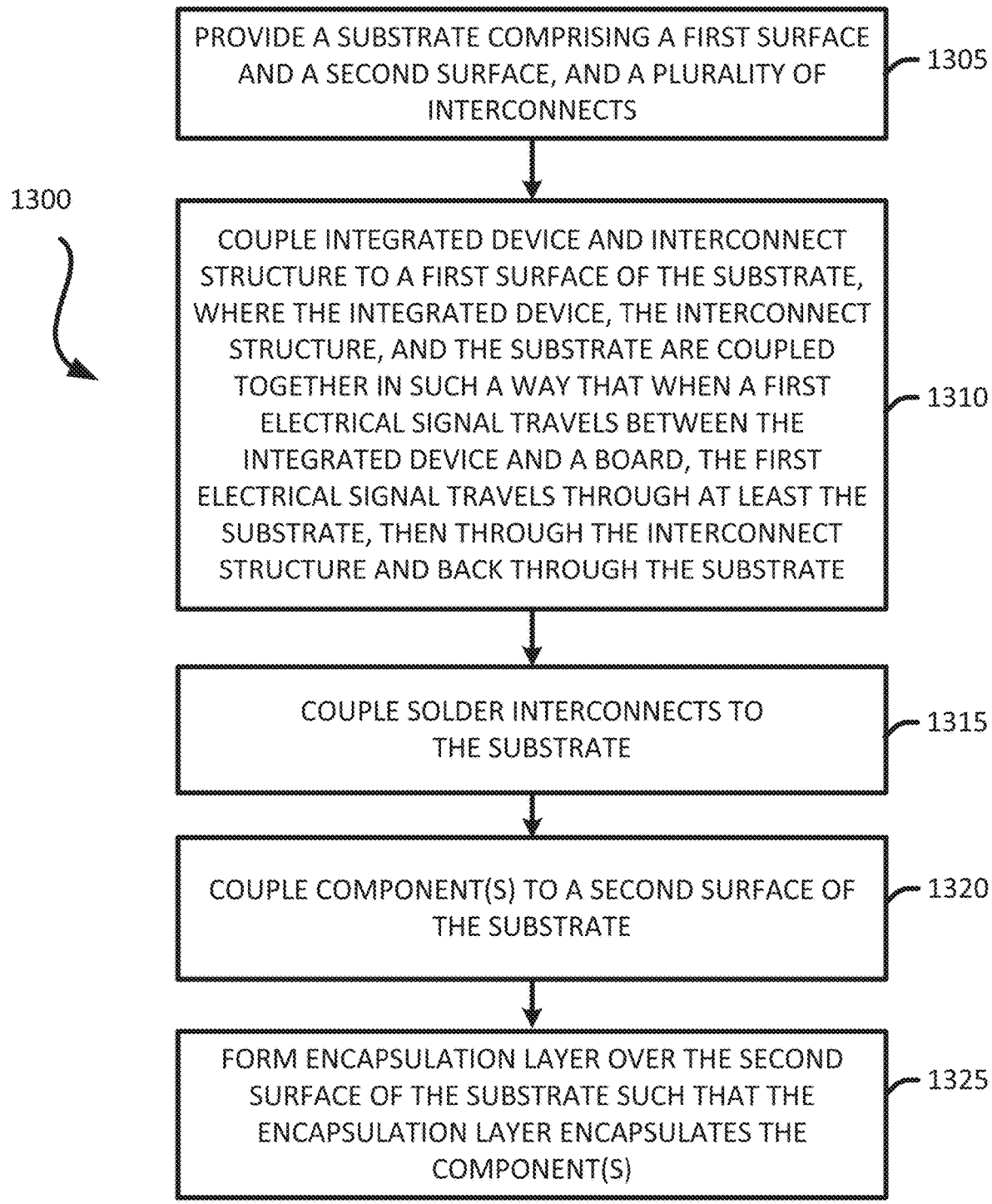
FIG. 13 illustrates an exemplary flow diagram of a method for fabricating a package that includes a high-density interconnect structure coupled to a substrate.

Exemplary Flow Diagram of a Method for Fabricating a Package That Includes a High-Density Interconnect Structure Coupled to a Substrate In some implementations, fabricating a package that includes a high-density interconnect structure coupled to a substrate includes several processes. FIG. 13 illustrates an exemplary flow diagram of a method 1300 for providing or fabricating a package that includes a high-density interconnect structure coupled to a substrate. In some implementations, the method 1300 of FIG. 13 may be used to provide or fabricate the package 200 of FIG. 2 described in the disclosure. However, the method 1300 may be used to provide or fabricate any of the packages described in the disclosure.

It should be noted that the method of FIG. 13 may combine one or more processes in order to simplify and/or clarify the method for providing or fabricating a package that includes a high-density interconnect structure coupled to a substrate. In some implementations, the order of the processes may be changed or modified.

The method provides (at 1305) a substrate (e.g., 202). The substrate 202 may be provided by a supplier or fabricated. The substrate 202 includes a first surface and a second surface. The substrate 202 includes at least one dielectric layer 220 and a plurality of interconnects 222. Different implementations may provide different substrates. A process similar to the process shown in FIGS. 10A-10C may be used to fabricate the substrate 202. However, different implementations may use different processes to fabricate the substrate 202. Stage 1 of FIG. 12A illustrates and describes an example of providing a substrate.

The method couples (at 1310) the first integrated device (e.g., 204) and the first interconnect structure (e.g., 210) to the first surface of the substrate (e.g., 202). The first integrated device 204 may be coupled to the substrate 202 through the plurality of interconnects 240. The plurality of interconnects 240 may be coupled to interconnects from the plurality of interconnects 222 of the substrate 202. The first integrated device 204 may be coupled to the substrate 202 such that the front side (e.g., active side) of the first integrated device 204 is facing the substrate 202. As an example, the integrated device 204 and the interconnect structure 210 may be coupled to the substrate 202 so that the integrated device, the interconnect structure, and the substrate are coupled together in such a way that when a first electrical signal travels between the integrated device and a board (e.g., 290), the first electrical signal travels through the substrate 202, then through the interconnect structure 210 and back through the substrate 202. Stages 2-4 of FIG. 12A illustrate and describes an example of an integrated device and an interconnect structure being coupled to a substrate. Coupling the integrated device to the substrate may also include providing an under fill (e.g., 242) between the first integrated device 204 and the substrate 202. Stage 3 of FIG. 12A illustrates and describes an underfill being provided.

The method couples (at 1315) a plurality of solder interconnects (e.g., 280) to the first surface of the substrate (e.g., 202). Stage 5 of FIG. 12A, illustrates and describes an example of coupling solder interconnects to the substrate.

The method couples (at 1320) components to a second surface of the substrate 202. Different implementations may couple different components and/or different number of components. Components can include the second integrated device 206, the second interconnect structure 230, and the passive device 706. In some implementations, the substrate may be flipped prior to the components being coupled to the substrate. Stage 7 of FIG. 12B, illustrates and describes various components being coupled to the second surface of the substrate.

The method forms (at 1325) an encapsulation layer (e.g., 208) over the second surface of the substrate (e.g., 202) such that the encapsulation layer 208 encapsulates the second integrated device 206 and the second interconnect structure 230. The process of forming and/or disposing the encapsulation layer 208 may include using a compression and transfer molding process, a sheet molding process, or a liquid molding process. Stage 8 of FIG. 12B, illustrates and describes an example of an encapsulation layer that is located over the substrate and encapsulates the integrated device.

Exemplary Electronic Devices

Figure 14:
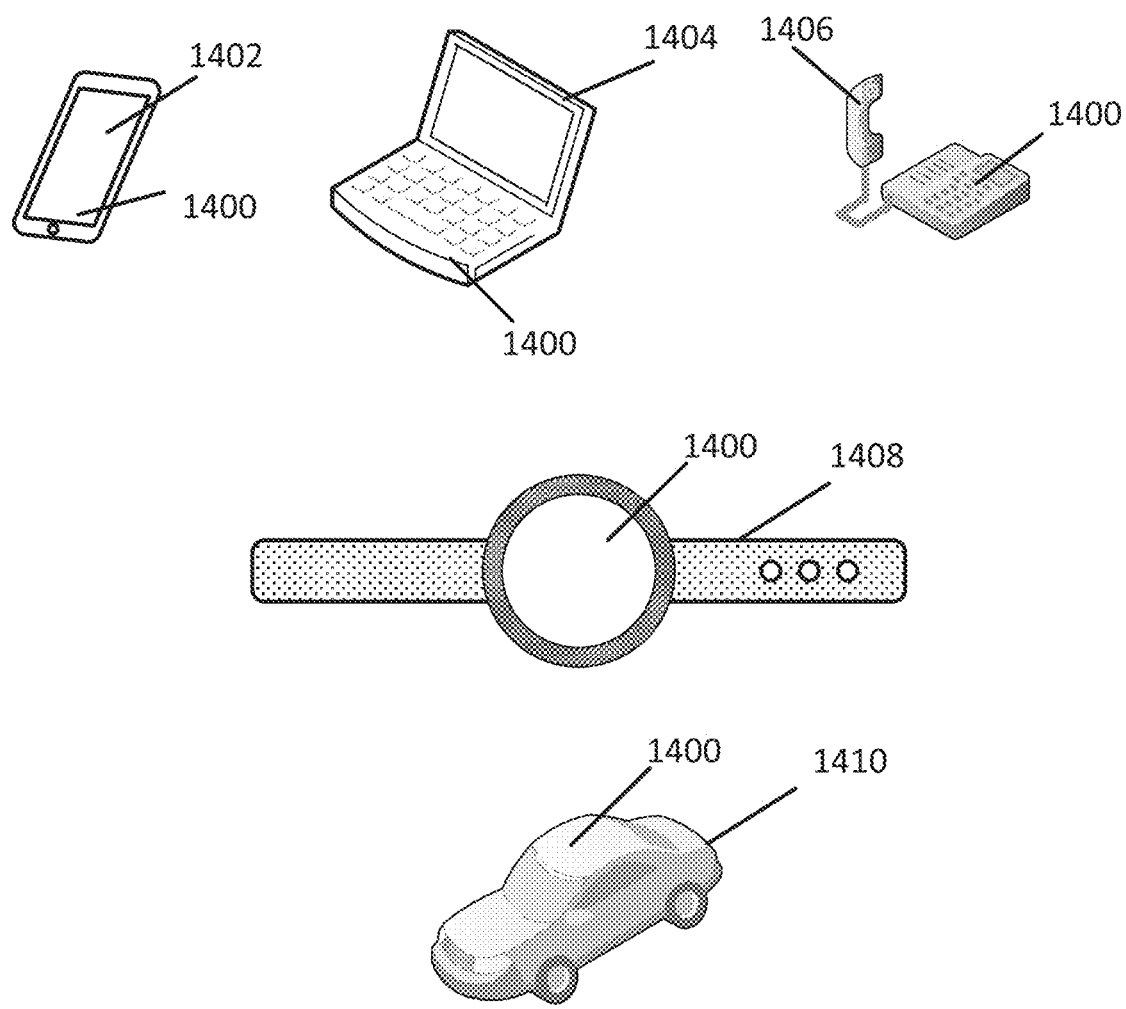
FIG. 14 illustrates various electronic devices that may integrate a die, an electronic circuit, an integrated device, an integrated passive device (IPD), a passive component, a package, and/or a device package described herein.

FIG. 14 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1402, a laptop computer device 1404, a fixed location terminal device 1406, a wearable device 1408, or automotive vehicle 1410 may include a device 1400 as described herein. The device 1400 may be, for example, any of the devices and/or integrated circuit (IC) packages described herein. The devices 1402, 1404, 1406 and 1408 and the vehicle 1410 illustrated in FIG. 14 are merely exemplary. Other electronic devices may also feature the device 1400 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-7, 8A-8D, 9, 10A-10C, 11, 12A-12B, and/or 13-14 may be rearranged and/or combined into a single component, process, feature or function or embodied in several components, processes, or functions. Additional elements, components, processes, and/or functions may also be added without departing from the disclosure. It should also be noted FIGS. 2-7, 8A-8D, 9, 10A-10C, 11, 12A-12B, and/or 13-14 and its corresponding description in the present disclosure is not limited to dies and/or ICs. In some implementations, FIGS. 2-7, 8A-8D, 9, 10A-10C, 11, 12A-12B, and/or 13-14 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The term "encapsulating" means that the object may partially encapsulate or completely encapsulate another object. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. An interconnect may include one or more metal components (e.g., seed layer+metal layer). In some implementations, an interconnect is an electrically conductive material that may be configured to provide an electrical path for a signal (e.g., a data signal, ground or power). An interconnect may be part of a circuit. An interconnect may include more than one element or component. An interconnect may be defined by one or more interconnects. Different implementations may use similar or different processes to form the interconnects. In some implementations, a chemical vapor deposition (CVD) process and/or a physical vapor deposition (PVD) process for forming the interconnects. For example, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

In the following, several non-limiting examples are given for facilitating understanding the present disclosure.

A package comprising a substrate comprising a first surface and a second surface, wherein the substrate further comprises a plurality of interconnects for providing electrical connections to a board; an electronic circuit (which may include an integrated device and/or be formed in an integrated device) coupled to the first surface or the second surface of the substrate or integrated into the substrate; and an interconnect structure coupled to the first surface of the substrate, wherein the electronic circuit, the interconnect structure and the substrate are coupled together in such a way that when a first electrical signal travels between the electronic circuit and a board, the first electrical signal travels through at least the substrate, then through the interconnect structure and back through the substrate. The interconnect structure may provide at least one electrical path (or electrical connection) between a first electrical contact provided by the substrate and a second electrical contact provided by the substrate, where the first contact is electrically connected to the electronic circuit and wherein the second contact is electrically connected to one or more of the interconnects.

A package comprising a substrate comprising a first surface and a second surface, wherein the substrate further comprises a plurality of interconnects for providing electrical connections between two integrated devices; a first electronic circuit (which may include an integrated device and/or be formed in an integrated device) coupled to the first surface or the second surface of the substrate or integrated into the substrate; a second electronic circuit (which may include an integrated device and/or be formed in an integrated device); and an interconnect structure coupled to the first surface of the substrate, wherein the electronic circuit, the interconnect structure and the substrate are coupled together in such a way that when a first electrical signal travels between the electronic circuit (e.g., first integrated device) and another electronic circuit (e.g., second integrated device), the first electrical signal travels through at least the substrate, then through the interconnect structure and back through the substrate. The interconnect structure may provide at least one electrical path (or electrical connection) between a first electrical contact provided by the substrate and a second electrical contact provided by the substrate, where the first contact is electrically connected to the electronic circuit and wherein the second contact is electrically connected to one or more of the interconnects.

An apparatus comprising a substrate comprising a first surface and a second surface, wherein the substrate further comprises a plurality of interconnects for providing electrical connections to a board; an electronic circuit (which may include an integrated device and/or be formed in an integrated device) coupled to the first surface or the second surface of the substrate or integrated into the substrate; and means for interconnect redistribution coupled to the first surface of the substrate, wherein the electronic circuit, the means for interconnect redistribution and the substrate are coupled together in such a way that when a first electrical signal travels between the electronic circuit and a board, the first electrical signal travels through at least the substrate, then through the means for interconnect redistribution and back through the substrate. The interconnect structure may provide at least one electrical path (or electrical connection) between a first electrical contact provided by the substrate and a second electrical contact provided by the substrate, where the first contact is electrically connected to the electronic circuit and wherein the second contact is electrically connected to one or more of the interconnects.

A method for fabricating a package, comprising providing a substrate comprising a first surface and a second surface, wherein the substrate further comprises a plurality of interconnects for providing electrical connections to a board; coupling an electronic circuit to the first surface or the second surface of the substrate or integrated into the substrate; and coupling an interconnect structure to the first surface of the substrate, wherein the electronic circuit, the interconnect structure, and the substrate are coupled together in such a way that when a first electrical signal travels between the electronic circuit and a board, the first electrical signal travels through at least the substrate, then through the interconnect structure and back through the substrate. The interconnect structure may provide at least one electrical path (or electrical connection) between a first electrical contact provided by the substrate and a second electrical contact provided by the substrate, where the first contact is electrically connected to the electronic circuit and wherein the second contact is electrically connected to one or more of the interconnects.

The invention claimed is:

1. A package comprising:
    a substrate comprising a plurality of first interconnects and a plurality of second interconnects, the plurality of second interconnects located on a first surface of the substrate and configured to electrically couple the substrate to a board or to a second substrate;
    an integrated device coupled to the substrate; and
    an interconnect structure coupled to the substrate,
    wherein the integrated device and the interconnect structure are located laterally to the plurality of second interconnects and located on the first surface of the substrate,
    wherein the integrated device, the interconnect structure and the substrate provide an electrical path from the integrated device to the substrate, from the substrate to the interconnect structure, and from the interconnect structure back to the substrate for a first electrical signal of the integrated device.

2. The package of claim 1,
    wherein the plurality of first interconnects of the substrate comprises a first minimum pitch, and
    wherein the interconnect structure comprises a plurality of third interconnects having a second minimum pitch that is less than the first minimum pitch.

3. The package of claim 1, wherein the interconnect structure comprises at least one dielectric layer and a plurality of redistribution interconnects.

4. The package of claim 1, wherein the interconnect structure comprises another substrate having a plurality of fourth interconnects.

5. The package of claim 1,
    wherein the integrated device is configured to perform a first function and a second function, and
    wherein the first function is configured to send the first electrical signal through the electrical path from the integrated device, through the substrate, then through the interconnect structure, and back through the substrate.

6. The package of claim 5, wherein the second function is associated with a second electrical path for a second electrical signal, the second electrical path from the integrated device, through the substrate, then through the interconnect structure, and back through the substrate.

7. The package of claim 5,
    wherein the second function is associated with a second electrical path for a second electrical signal, the second electrical path from the integrated device, through the substrate, and
    wherein the second electrical path bypasses the interconnect structure.

8. The package of claim 1, wherein the package is coupled to the board such that the integrated device and the interconnect structure are located between the substrate and the board.

9. The package of claim 8, wherein the package is part of a package on package (PoP).

10. The package of claim 1, further comprising:
    a second integrated device coupled to a second surface of the substrate, and
    a second interconnect structure coupled to a second surface of the substrate.

11. The package of claim 1, wherein the package is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

12. An apparatus comprising:
    a substrate comprising a plurality of interconnects and a plurality of second interconnects, the plurality of second interconnects located on a first surface of the substrate and configured to electrically couple the substrate to a board or to a second substrate;
    an integrated device coupled to the substrate; and
    means for interconnect redistribution coupled to a surface of the substrate,
    wherein the integrated device and the means for interconnect redistribution are located laterally to the plurality of second interconnects and located on the first surface of the substrate,
    wherein the integrated device, the means for interconnect redistribution and the substrate provide an electrical path from the integrated device to the substrate, from the substrate to the means for interconnect redistribution, and from the means for interconnect redistribution back to the substrate for a first electrical signal of the integrated device.

13. The apparatus of claim 12,
    wherein the plurality of first interconnects of the substrate comprises a first minimum pitch, and
    wherein the means for interconnect redistribution comprises a plurality of third interconnects having a second minimum pitch that is less than the first minimum pitch.

14. The apparatus of claim 12, wherein the means for interconnect redistribution comprises at least one dielectric layer and a plurality of redistribution interconnects.

15. The apparatus of claim 12, wherein the means for interconnect redistribution comprises another substrate having a plurality of fourth interconnects.

16. The apparatus of claim 12,
    wherein the integrated device is configured to perform a first function and a second function, and wherein the first function is configured to send the first electrical signal through the electrical path from the integrated device, through the substrate, then through the means for interconnect redistribution, and back through the substrate.

17. The apparatus of claim 16, wherein the second function is associated with a second electrical path for a second electrical signal, the second electrical path from the integrated device, through the substrate, then through the means for interconnect redistribution, and back through the substrate.

18. The apparatus of claim 16,
wherein the second function is associated with a second electrical path for a second electrical signal, the second electrical path from the integrated device, through the substrate, and
wherein the second electrical path bypasses the means for interconnect redistribution.

19. The apparatus of claim 12, wherein the apparatus is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

20. A method for fabricating a package, comprising:
providing a substrate comprising a plurality of interconnects and a plurality of second interconnects, the plurality of second interconnects located on a first surface of the substrate and configured to electrically couple the substrate to a board or to a second substrate;
coupling an integrated device to the substrate; and
coupling an interconnect structure to of the substrate,
wherein the integrated device and the interconnect structure are located laterally to the plurality of second interconnects and located on the first surface of the substrate,
wherein the integrated device, the interconnect structure, and the substrate provide an electrical path from the integrated device to the substrate, from the substrate to the interconnect structure, and from the interconnect structure back to the substrate for a first electrical signal of the integrated device.

21. The method of claim 20,
wherein the plurality of first interconnects of the substrate comprises a first minimum pitch, and
wherein the interconnect structure comprises a plurality of third interconnects having a second minimum pitch that is less than the first minimum pitch.

22. The method of claim 20, wherein the interconnect structure comprises at least one dielectric layer and a plurality of redistribution interconnects.

23. The method of claim 20, wherein the interconnect structure comprises another substrate having a plurality of interconnects.

24. The method of claim 20,
wherein the integrated device is configured to perform a first function and a second function, and
wherein the first function is configured to send the first electrical signal through the electrical path from the integrated device, through the substrate, then through the interconnect structure, and back through the substrate.

25. The method of claim 24, wherein the second function is associated with a second electrical path for a second electrical signal, the second electrical path from the integrated device, through the substrate, then through the interconnect structure, and back through the substrate.

26. The method of claim 24,
wherein the second function is associated with a second electrical path for a second electrical signal, the second electrical path from the integrated device, through the substrate, and
wherein the second electrical path bypasses the interconnect structure.

27. The package of claim 1, further comprising:
a third integrated device coupled to the surface of the second substrate; and
a third interconnect structure coupled to the surface of the second substrate.

* * * * *